(12) United States Patent
Meiser et al.

(10) Patent No.: US 12,300,724 B2
(45) Date of Patent: May 13, 2025

(54) METHOD OF MANUFACTURING SILICON CARBIDE SEMICONDUCTOR DEVICES

(71) Applicant: Infineon Technologies AG, Neubiberg (DE)

(72) Inventors: Andreas Meiser, Sauerlach (DE); Caspar Leendertz, Munich (DE); Anton Mauder, Kolbermoor (DE); Roland Rupp, Lauf (DE)

(73) Assignee: Infineon Technologies AG, Neubiberg (DE)

( * ) Notice: Subject to any disclaimer, the term of this patent is extended or adjusted under 35 U.S.C. 154(b) by 344 days.

(21) Appl. No.: 17/496,050

(22) Filed: Oct. 7, 2021

(65) Prior Publication Data

US 2022/0028980 A1   Jan. 27, 2022

Related U.S. Application Data

(60) Continuation of application No. 16/745,015, filed on Jan. 16, 2020, now Pat. No. 11,177,354, which is a
(Continued)

(30) Foreign Application Priority Data

Mar. 24, 2017   (DE) .......................... 102017106398.6

(51) Int. Cl.
*H01L 29/16* (2006.01)
*H01L 21/02* (2006.01)
(Continued)

(52) U.S. Cl.
CPC .... *H01L 29/1608* (2013.01); *H01L 21/02529* (2013.01); *H01L 29/0623* (2013.01);
(Continued)

(58) Field of Classification Search
CPC ............ H01L 29/7813; H01L 29/7397; H01L 29/7804; H01L 29/297827; H01L 29/7896;
(Continued)

(56) References Cited

U.S. PATENT DOCUMENTS 8,704,295 B1   4/2014   Darwish et al.
9,136,372 B2   9/2015   Miyahara et al.
(Continued)

FOREIGN PATENT DOCUMENTS

CN          103367405 A     10/2013
DE       102010000531 A1    10/2010
(Continued)

*Primary Examiner* — Antonio B Crite
(74) *Attorney, Agent, or Firm* — Murphy, Bilak & Homiller, PLLC

(57) ABSTRACT

A semiconductor device includes a trench structure extending from a first surface into a silicon carbide semiconductor body, the trench structure having a gate electrode that is dielectrically insulated from the semiconductor body, a shielding region adjoining a bottom of the trench structure and forming a first pn junction with a drift structure of the semiconductor body, a body region forming a second pn junction with the drift structure, a source zone arranged between the first surface and the body region and forming a third pn junction with the source zone, wherein a contact portion of the body region extends to the first surface, wherein the source zone surrounds the contact portion of the body region at the first surface, and wherein the trench structure forms an enclosed loop at the first surface that surrounds the source zone and the contact portion of the body region at the first surface.

13 Claims, 22 Drawing Sheets

Related U.S. Application Data division of application No. 15/934,518, filed on Mar. 23, 2018, now Pat. No. 10,586,851.

(51) Int. Cl.

| | |
|---|---|
| *H01L 29/04* | (2006.01) |
| *H01L 29/06* | (2006.01) |
| *H01L 29/40* | (2006.01) |
| *H01L 29/417* | (2006.01) |
| *H01L 29/423* | (2006.01) |
| *H01L 29/66* | (2006.01) |
| *H01L 29/739* | (2006.01) |
| *H01L 29/78* | (2006.01) |

(52) U.S. Cl.
CPC ........ *H01L 29/0696* (2013.01); *H01L 29/402* (2013.01); *H01L 29/417* (2013.01); *H01L 29/41766* (2013.01); *H01L 29/42376* (2013.01); *H01L 29/66068* (2013.01); *H01L 29/7804* (2013.01); *H01L 29/7813* (2013.01); H01L 29/045 (2013.01); H01L 29/0649 (2013.01); H01L 29/407 (2013.01); H01L 29/7396 (2013.01); H01L 29/7397 (2013.01)

(58) Field of Classification Search
CPC ............... H01L 29/4236; H01L 29/407; H01L 29/1095; H01L 29/1068; H01L 29/402; H01L 29/41766; H01L 29/0623
See application file for complete search history.

(56) References Cited

U.S. PATENT DOCUMENTS

| | | | |
|---|---|---|---|
| 2004/0195618 A1* | 10/2004 | Saito | H01L 29/7802 |
| | | | 257/E29.066 |
| 2006/0214221 A1 | 9/2006 | Challa et al. | |
| 2007/0114602 A1 | 5/2007 | Saito et al. | |
| 2012/0061753 A1* | 3/2012 | Nishiwaki | H01L 29/407 |
| | | | 257/E29.264 |
| 2013/0137230 A1 | 5/2013 | Blank | |
| 2014/0145206 A1 | 5/2014 | Siemieniec et al. | |
| 2015/0129893 A1 | 5/2015 | Nakano | |
| 2016/0172468 A1 | 6/2016 | Esteve et al. | |
| 2016/0190301 A1 | 6/2016 | Aichinger et al. | |
| 2017/0077290 A1* | 3/2017 | Kono | H01L 29/0634 |
| 2017/0271323 A1* | 9/2017 | Sugawara | H01L 29/7397 |
| 2018/0097061 A1 | 4/2018 | Mimura et al. | |
| 2018/0114845 A1* | 4/2018 | Mimura | H01L 29/518 |
| 2018/0277637 A1 | 9/2018 | Meiser et al. | |

FOREIGN PATENT DOCUMENTS

| | | |
|---|---|---|
| DE | 102013214196 A1 | 1/2014 |
| DE | 102014119465 B3 | 5/2016 |
| DE | 102014117556 A1 | 6/2016 |
| DE | 102014117780 A1 | 6/2016 |
| DE | 102015103072 A1 | 9/2016 |
| DE | 102015108440 B3 | 10/2016 |
| JP | 2004031385 A | 1/2004 |
| JP | 4086558 B2 | 5/2008 |
| JP | 2013201400 A | 10/2013 |
| JP | 2016181618 A | 10/2016 |
| WO | 2010110246 A1 | 9/2010 |
| WO | 2016052203 A1 | 4/2016 |

* cited by examiner

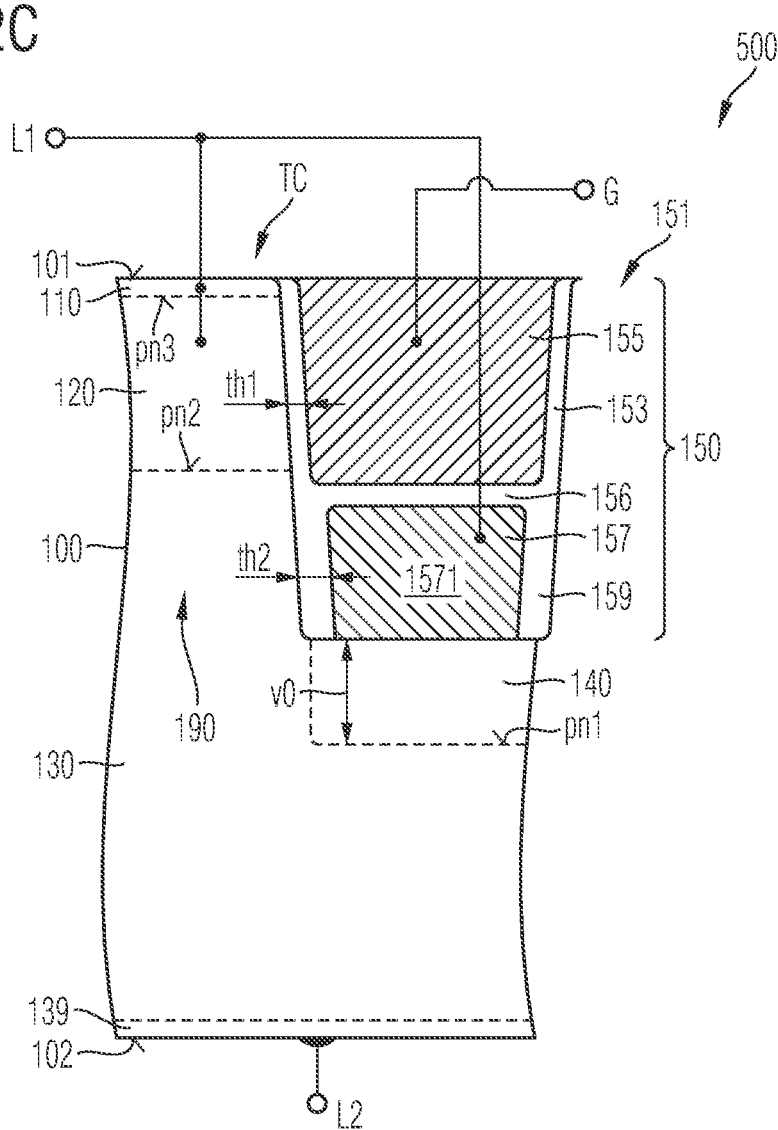

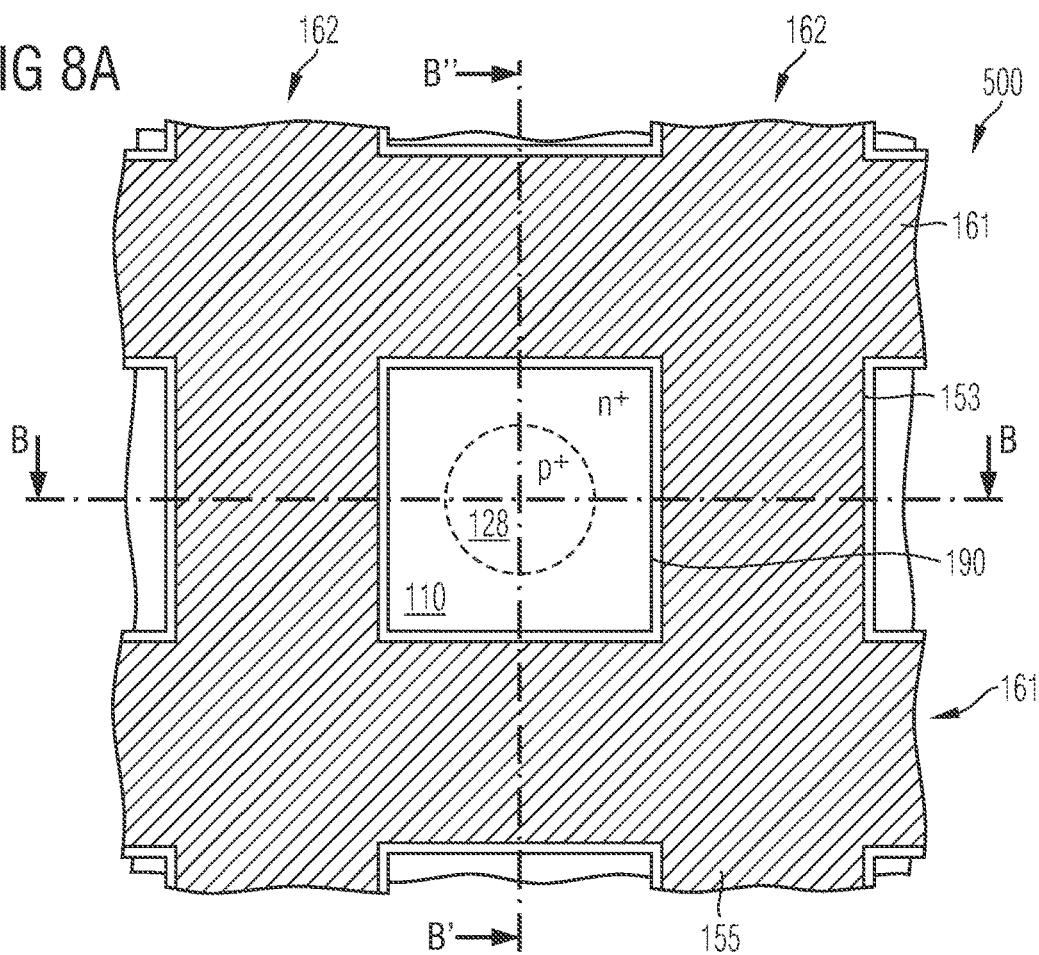
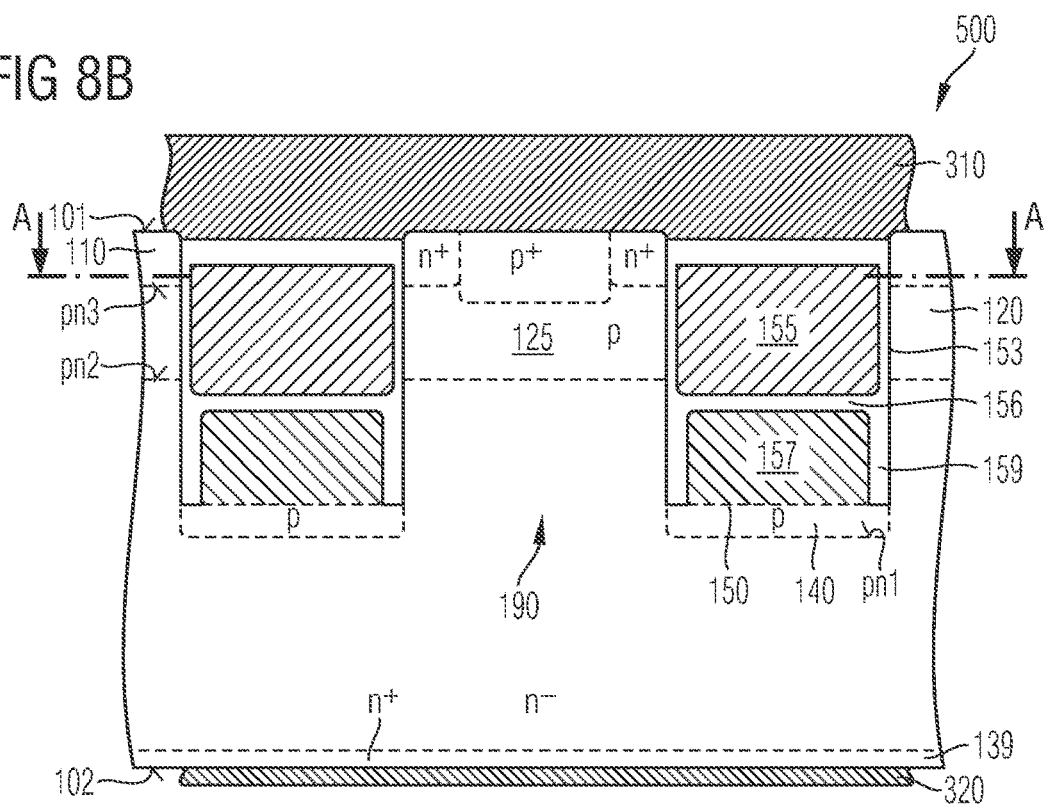

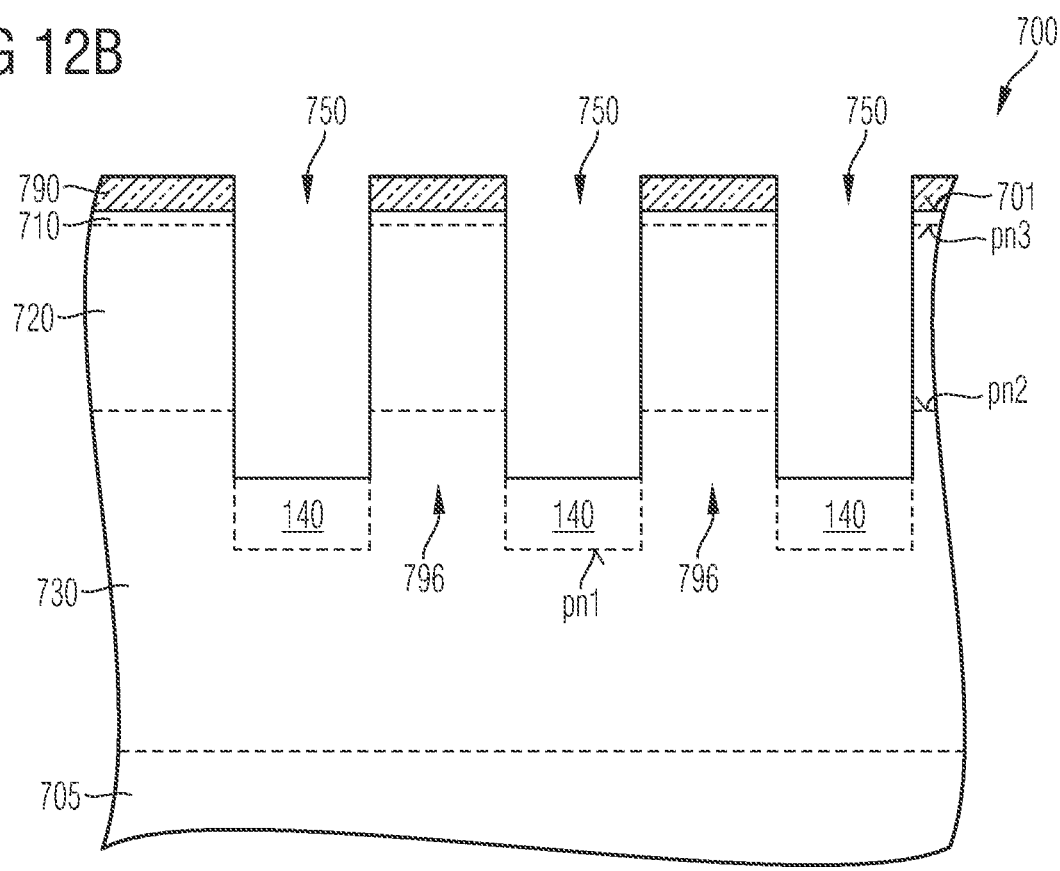
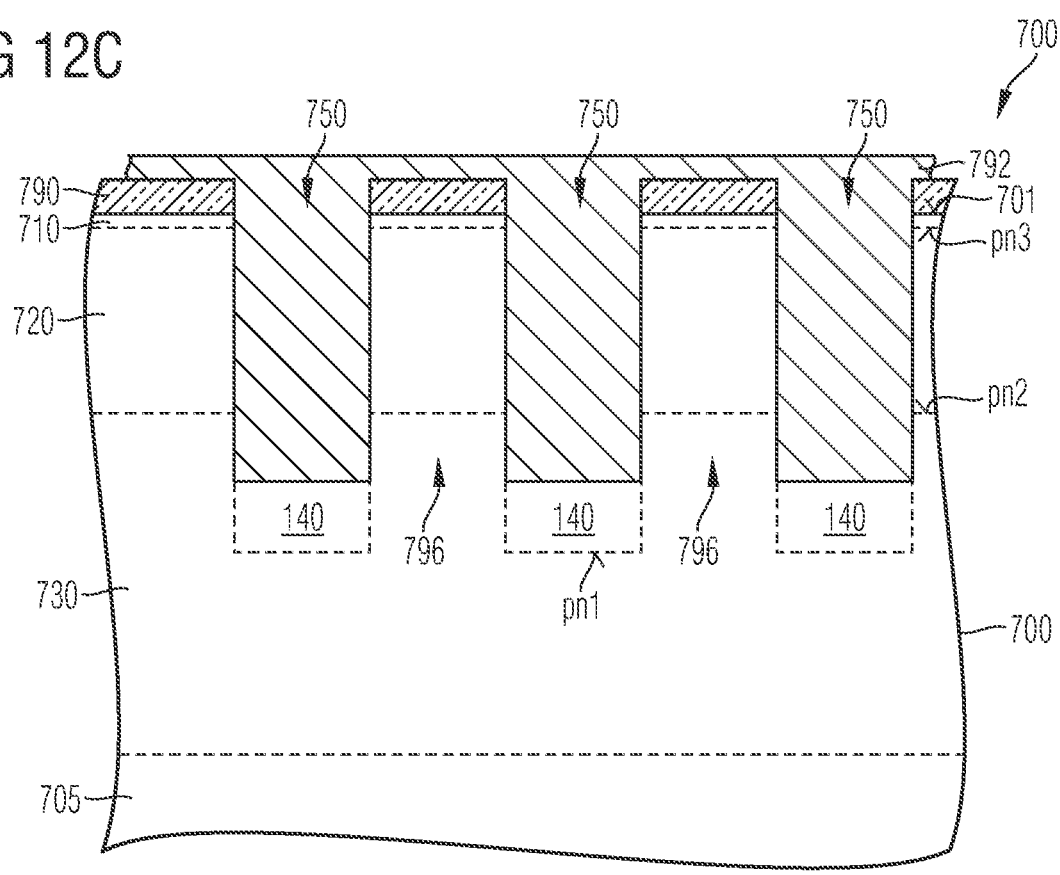

METHOD OF MANUFACTURING SILICON CARBIDE SEMICONDUCTOR DEVICES

BACKGROUND

Power semiconductor devices combine high maximum current density with high voltage blocking capability. Typical power semiconductor devices have a vertical structure such that the load current flows between two opposite sides of a semiconductor die. In vertical devices the maximum current rating of the power semiconductor device is proportional to its area and the voltage blocking capability is positively correlated with the height or vertical extension of a drift region in the semiconductor die. In power semiconductor switches such as IGFETs (insulated gate field effect transistors) and IGBTs (insulated gate bipolar transistors) a gate electrode, which is capacitively coupled to body regions through a gate dielectric, controls a load current through the body regions. High blocking voltages result in strong electric fields near the gate dielectric such that instead of the properties of the drift region the dielectric strength of the gate dielectric may determine the voltage blocking capability of the power semiconductor device in case of semiconductors with high intrinsic breakdown field strength like SiC.

There is a need for further increasing the voltage blocking capability and for improving avalanche ruggedness of semiconductor devices without or with only low adverse impact on the current rating and on-state resistivity.

SUMMARY

The present disclosure relates to a semiconductor device that includes a trench structure, which extends from a first surface into a silicon carbide semiconductor body. The trench structure may include an auxiliary electrode at a bottom of the trench structure and a gate electrode, which may be arranged between the auxiliary electrode and the first surface. A shielding region may adjoin the auxiliary electrode at the bottom of the trench structure and may form a first pn junction with a drift structure.

The present disclosure further relates to a semiconductor device that includes trench structures extending from a first surface into a silicon carbide semiconductor body. The trench structures include first and second segments. Each first and second segment extends from a first sidewall to an opposite second sidewall of the trench structures. A gate electrode in the first segments is dielectrically insulated from the semiconductor body at a bottom of the trench structure. An auxiliary electrode is formed in the second segments. Shielding regions adjoin the auxiliary electrode at the bottom of the trench structures and form first pn junctions with a drift structure in the semiconductor body. A field dielectric separates the auxiliary electrode and the drift structure.

The present disclosure also relates to a method of manufacturing silicon carbide devices. Trenches are formed in a process surface of a silicon carbide substrate that includes a body layer, which forms second pn junctions with a drift layer structure, wherein the body layer is between the process surface and the drift layer structure. The trenches expose the drift layer structure. Dopants are implanted through a bottom of the trenches to form shielding regions that form first pn junctions with the drift layer structure. Dielectric spacers are formed on sidewalls of the trenches. A buried portion of an auxiliary electrode is formed in a bottom section of the trenches, wherein the buried portion adjoins the shielding regions.

Further embodiments are described in the dependent claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments and together with the description serve to explain principles of the embodiments. Further embodiments and intended advantages will be readily appreciated as they become better understood by reference to the following detailed description.

FIG. 2C is a schematic perspective view of a portion of a semiconductor device according to another embodiment, wherein the first and second segments alternate along a longitudinal axis of a trench structure.

FIGS. 8A and 8B show schematic horizontal and vertical cross-sectional views of a portion of a semiconductor device according to an embodiment related to a grid-shaped trench structure.

FIG. 12B is a schematic vertical cross-sectional view of the semiconductor substrate portion of FIG. 12A, after forming the shielding regions in the vertical projection of the trenches.

FIG. 12C is a schematic vertical cross-sectional view of the semiconductor substrate portion of FIG. 12B during a heating treatment.

DETAILED DESCRIPTION

In the following detailed description, reference is made to the accompanying drawings, which form a part hereof and in which are shown by way of illustrations of specific embodiments. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or heavily doped semiconductor material. The term "electrically coupled" includes that one or more intervening element(s) adapted for signal transmission may be between the electrically coupled elements, for example, elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
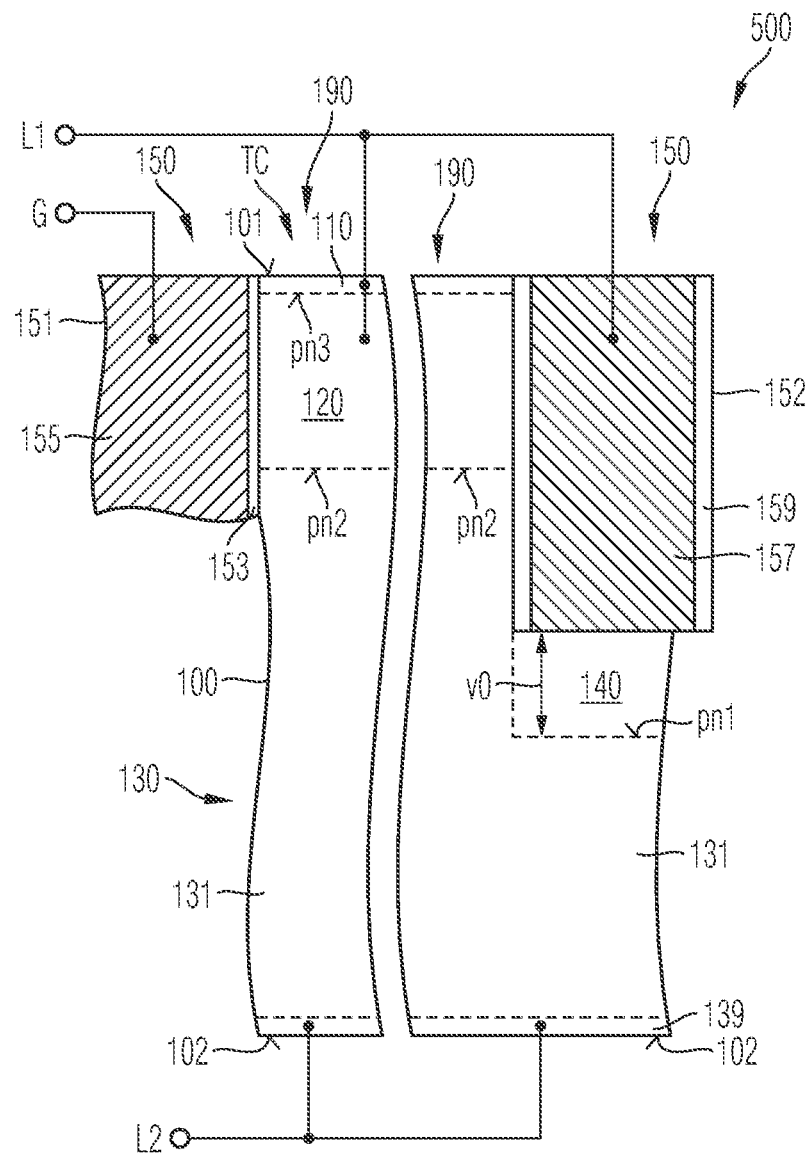
FIG. 1 is a schematic vertical cross-sectional view of a portion of a semiconductor device including trench structures with first segments, in which a gate electrode is formed at least in a top section, and with second segments, in which an auxiliary electrode extends between a first surface and a shielding region, according to an embodiment.

FIG. 1 refers to a semiconductor device 500 including transistor cells TC. The semiconductor device 500 may be or may include an IGFET (insulated gate field effect transistor), for example, an MOSFET (metal oxide semiconductor FET) in the usual meaning concerning FETs with metal gates as well as FETs with gates from semiconductor material, an IGBT (insulated gate bipolar transistor) or an MCD (MOS controlled diode), by way of example.

The semiconductor device 500 includes a semiconductor body 100 based on silicon carbide (SiC). The transistor cells TC are formed at a front side defined by a first surface 101 of the semiconductor body 100. A drift structure 130 is formed between the transistor cells TC and a second surface 102 of the semiconductor body 100 on a rear side, wherein the second surface 102 is parallel to the first surface 101. Directions parallel to the first and second surfaces 101, 102 are horizontal directions and a direction orthogonal to the first surface 101 defines a vertical direction.

The drift structure 130 may include a heavily doped base portion 139, which may directly adjoin the second surface 102, as well as a lightly doped drift zone 131 between the transistor cells TC and the heavily doped base portion 139. The drift structure 130 may further include current spread zones. The current spread zones may be arranged between the body region 120 and the lightly doped drift zone 131. The current spread zones have a higher doping concentration than the drift zone 131.

Trench structures 150 extend from the first surface 101 into the semiconductor body 100 and into the drift structure 130. Mesa portions 190 of the semiconductor body 100 directly adjoin the trench structures 150 laterally and separate neighboring trench structures 150 from each other. A trench structure 150 may comprise at least one trench in the semiconductor body 100. Throughout this specification, a trench may be an electrode trench of the semiconductor device 500.

A mesa portion 190 includes the body region 120 forming a second pn junction pn2 with the drift structure 130 and a third pn junction pn3 with a source zone 110, wherein the source zone 110 is between the body region 120 and the first surface 101.

The trench structures 150 include first segments 151 and second segments 152. The first and second segments 151, 152 transversely extend from a first sidewall of the trench structure 150 to an opposite second sidewall, wherein the first and second sidewalls are tilted, e.g., vertical to the first surface 101. The first and second sidewalls form long sides of the trench structures 150 that extend perpendicular to the cross-sectional plane.

The first segments 151 include a gate electrode 155, which is formed at least in a top section of the first segments 151, wherein the top section is oriented to the first surface 101. The gate electrode 155 may be formed exclusively in the top section such that the gate electrode 155 is spaced apart from a bottom of the trench structure 150, e.g., by a buried portion of an auxiliary electrode 157. According to other embodiments, the gate electrode 155 extends from the top to the bottom of the first segments 151, wherein a dielectric structure, e.g., a portion of a gate dielectric 153 or another dielectric dielectrically insulates the gate electrode 155 from the semiconductor body 100 along a bottom of the trench structures 150. A gate dielectric 153 may electrically separate the gate electrode 155 from the semiconductor body 100. The gate electrode 155 may completely fill a top portion of the first segments 151 between two portions of the gate dielectric 153 on opposite long sides of the first segments 151.

The second segments 152 include an auxiliary electrode 157 extending from at least a plane coplanar with the first surface 101 to the bottom of the trench structures 150. A field dielectric 159 may laterally separate the auxiliary electrode 157 from the semiconductor body 100, for example, from the drift structure 130. A thickness of the field dielectric 159 may be equal to or greater than a thickness of the gate dielectric 153. The auxiliary electrode 157 may completely fill the portion of the trench structure 150 in the bottom portion between portions of the field dielectric 159 on opposite long sides of the trench structures 150.

The gate electrode 155 may be electrically connected to a gate terminal G. The source zones 110 and the body regions 120 may be electrically connected to a first load terminal L1. The auxiliary electrode 157 may be electrically connected to the first load electrode L1, to another terminal of the semiconductor device 500 or to an output of an internal driver or voltage regulator circuit.

A shielding region 140 at the bottom of at least the second segments 152 is in ohmic contact, in particular in low-ohmic contact, with the auxiliary electrode 157 and forms a first pn junctions pn1 with the drift structure 130. The shielding region 140 may be formed in the vertical projection of at least the second segments 152 and may directly adjoin the auxiliary electrode 157. A vertical extension v0 of the shielding region 140 may be at least 500 nm, for example, at least 1.5 μm or at least 2.0 μm. The semiconductor device 500 may comprise a plurality of separate shielding regions 140. Portions of the drift structure 130, for instance, may separate the shielding regions 140, from each other. The plurality of shielding regions 140 may form a plurality of respective first pn junctions pn1 with the drift structure 130.

The transistor cells TC may be of the n-channel type with p-doped body region 120, n-doped source zone 110 and n-doped drift zone 131 or may be p-channel transistor cells with n-doped body region 120, p-doped source zone 110 and p-doped drift zone 131. The following description refers to semiconductor devices 500 with n-channel transistor cells TC. Similar considerations apply to semiconductor devices with p-channel transistor cells TC.

A voltage at the gate terminal G above a threshold voltage turns the transistor cells TC on. By field effect accumulated minority charge carriers form inversion channels in the body regions 120 along the gate dielectric 153. The inversion channels connect the source zones 110 with the drift structure 130 such that a load current flows through the body regions 120 and between the first and the second load terminals L1, L2.

If a voltage at the gate terminals G falls below the threshold voltage, the transistor cells TC turn off. In the off-state the second pn junction pn2 remains reverse biased and the vertical extension of the drift zone 131 as well as the dopant concentration in the drift zone 131 between the second pn junction pn2 and the base portion 139 determines the voltage blocking capability of the semiconductor device 500. A depletion layer laterally extending from the shielding region 140 shields the gate dielectric 153 to a certain degree against the potential at the second load electrode L2 and clamps a voltage breakdown at the first pn junction pn1. The buried auxiliary electrode 157 forms part of a direct, low-ohmic connection between the shielding region 140 and, e.g., the first load terminal L1.

The auxiliary electrode 157 is from a material in which charge carrier mobility is significantly higher than in heavily doped single-crystalline silicon carbide. For example, the auxiliary electrode 157 may consist of or include a metal-containing layer and/or heavily doped polycrystalline silicon. In case of an avalanche breakdown, the auxiliary electrode drains off the avalanche current to the first load terminal L1 along a low-ohmic path and without a vertical charge carrier flow through the mesa portions 190, wherein the charge carriers may be effective as a base current for a parasitic npn bipolar junction transistor formed by the source zone 110, the body region 120 and the drift zone 131. In this way the auxiliary electrode 157 in combination with the shielding region 140 significantly improves avalanche ruggedness of the semiconductor device 500.

Compared to approaches with a connection of shielding regions through a doped region in a mesa portion 190, more semiconductor material can be assigned to the transistor functionality. A distance between neighboring trench structures 150 may be reduced and a dopant concentration in portions of the drift structure 130 directly adjoining the body regions 120 can be further increased to decrease a connection resistance between the inversion channels and the drift structure 130.

The first segments 151 and the second segments 152 are formed next to each other such that a lateral extension of a depletion region along the first pn junction pn1 reduces the electric field strength effective in the gate dielectric 153.

Figure 2A:
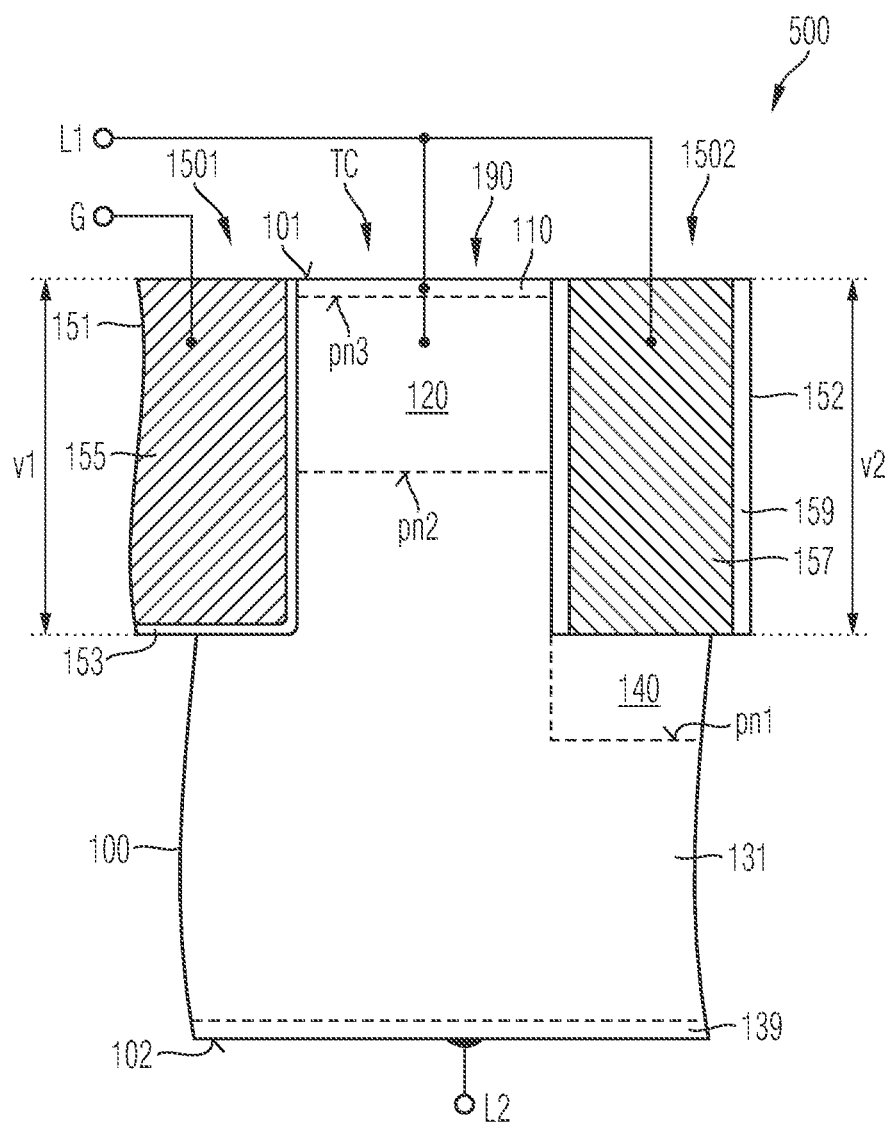
FIG. 2A is a schematic vertical cross-sectional view of a portion of a semiconductor device according to an embodiment with the first segments formed in first trench structures and with the second segments formed in second trench structures.
Figure 2B:
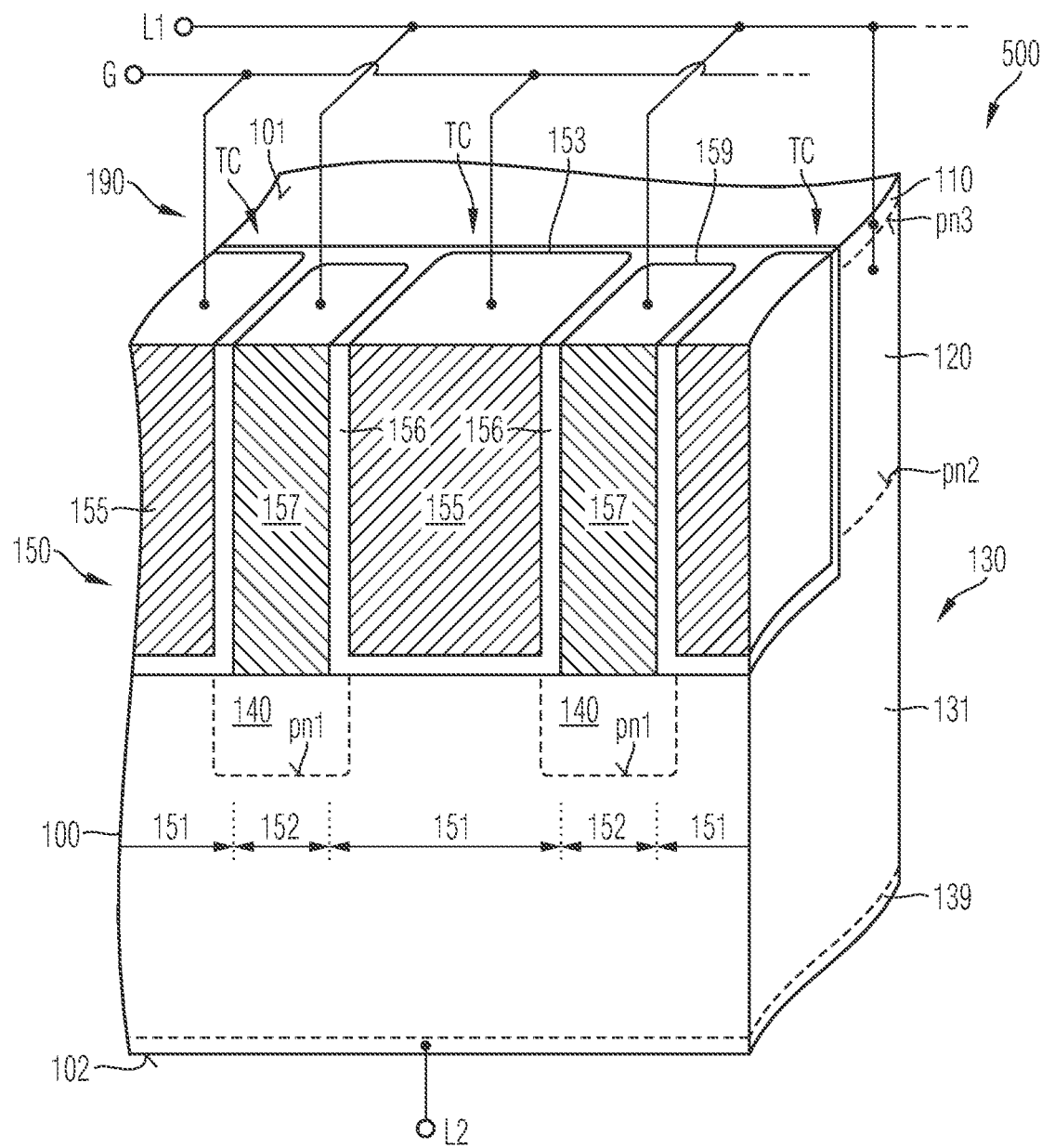
FIG. 2B is a schematic perspective view of a portion of a semiconductor device according to a further embodiment, wherein in the first segments the gate electrode spaces a buried portion of the auxiliary electrode apart from a first surface of a semiconductor body.

FIGS. 2A and 2B show different embodiments of the first and second segments 151, 152, wherein in FIG. 2A the first and second segments 151, 152 are formed in different trench structures 150 and in FIG. 2B the first and second segments 151, 152 are formed in different sections of the same trench structure 150 In FIG. 2A first segments 151 are exclusively formed in first trench structures 1501 and second segments 152 are exclusively formed in second trench structures 1502, wherein the first and second trench structures 1501, 1502 are separated from each other by mesa portions 190.

The first and second trench structures 1501, 1502 may be stripe-shaped with longitudinal axes orthogonal to the cross-sectional plane, wherein the first and second trench structures 1501, 1502 may have the same width and the same vertical extension. According to other embodiments, a first vertical extension v1 of the first trench structures 1501 may be smaller than a second vertical extension v2 of the second trench structures 1502. One, two or more first trench structures 1501 may be arranged between a pair of neighboring second trench structures 1502.

A gate electrode 155 extends from the first surface 101 to a bottom of the first trench structures 1501. An auxiliary electrode 157 extends from the first surface 101 to a bottom of the second trench structures 1502. The gate electrode 155 and the auxiliary electrode 157 may result from one single deposition process of heavily p-doped polycrystalline silicon. A gate dielectric 153 separating the gate electrode 155 from the semiconductor body 100 may have a thickness equal to or smaller than a thickness of a field dielectric 159 laterally separating the auxiliary electrode 157 from, inter alia, the drift structure 130.

In FIG. 2B the first segments 151 and the second segments 152 alternate along horizontal longitudinal axes of the trench structures 150. An extension of the second segments 152 along the longitudinal axes of the trench structure 150 is selected such that the electric field strength in a bottom portion of the gate dielectric 153 directly adjoining the drift structure 130 is reduced to a degree that the avalanche breakdown is pinned at the first pn junction pn1. A separation dielectric 156 electrically insulates the auxiliary electrode 157 from the gate electrode 155 in the same trench structure 150. The gate dielectric 153 may have the same thickness as the field dielectric 159 or the gate dielectric 153 may be thinner than the field dielectric 159.

In FIG. 2C a gate electrode 155 is arranged between a buried portion 1571 of the auxiliary electrode 157 and the first surface 101 along the vertical direction such that the gate electrode 155 spaces the buried portion 1571 of the auxiliary electrode 157 apart from a plane coplanar with the first surface 101 in first segments 151 of a trench structure 150. A gate dielectric 153 with a first thickness th1 laterally separates the gate electrode 155 from at least the body region 120. A field dielectric 159 with a second thickness th2, which may be greater than the first thickness th1, laterally separates the auxiliary electrode 157 from at least the drift structure 130.

Apart from a dielectric separation between the gate electrode 155 and the semiconductor body 100, the gate electrode 155 may fill a complete top section of the trench structure 150. The auxiliary electrode 157 may completely fill the trench structure 150 between two portions of the field dielectric 159 on opposite sidewalls on long sides of the trench structure 150 in the bottom section of the trench structures 150.

A shielding region 140 in the vertical projection of the trench structure 150 may have a vertical extension v0 of at least 0.5 µm, for example at least 1.5 µm.

Figure 2D:
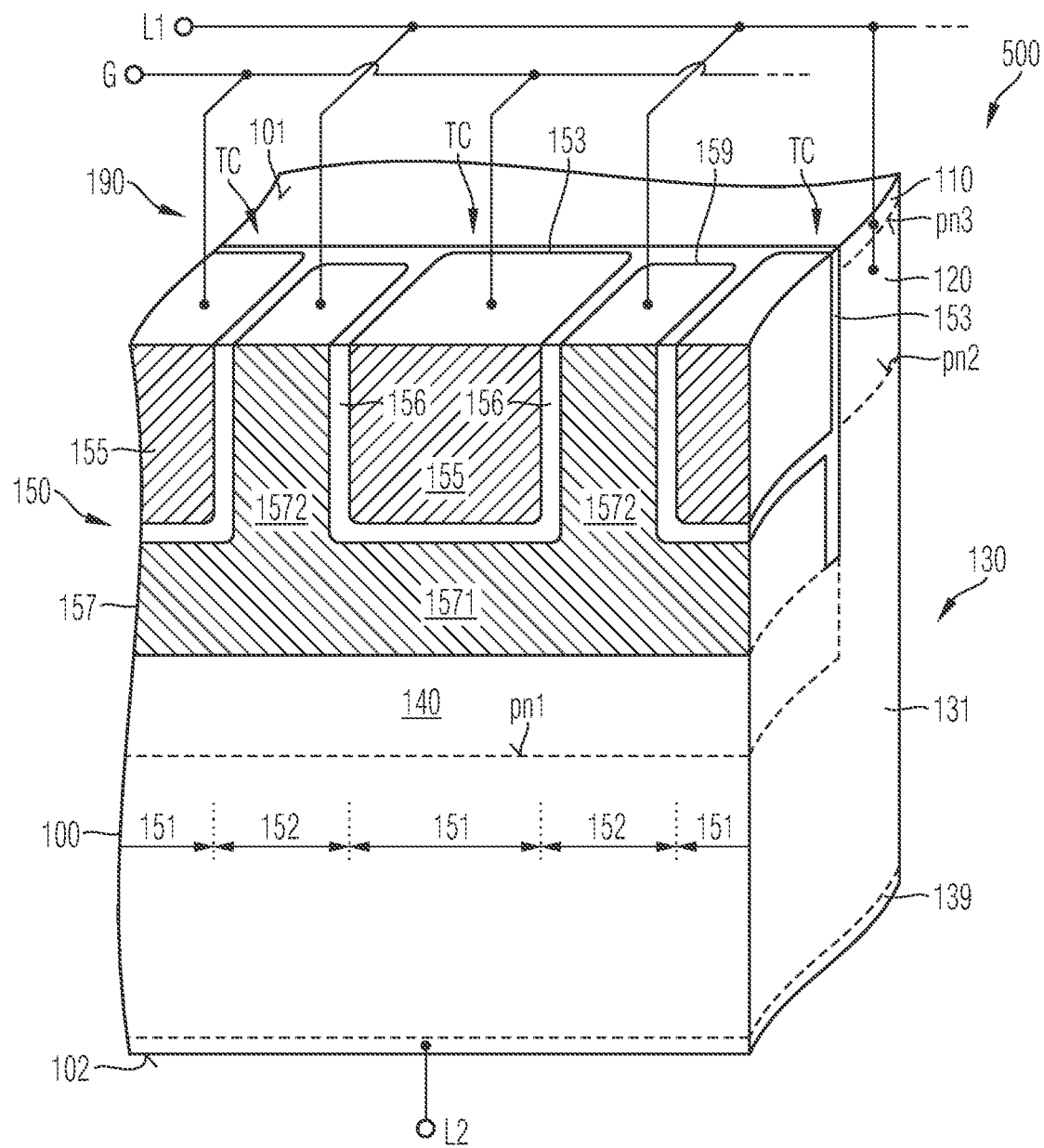
FIG. 2D is a schematic vertical cross-sectional view of a portion of a semiconductor device according to a further embodiment with a gate electrode spacing a buried portion of an auxiliary electrode from a first surface in first segments of trench structures.

In a second segment in a plane parallel to the cross-sectional plane of FIG. 2D, the trench structure 150 may include a connection structure electrically connecting the auxiliary electrode 157 with the first load terminal L1, with an auxiliary terminal or with an internal network node of the semiconductor device 500. The connection structure may be a deep contact. According to an embodiment, gate electrode 155 and separation dielectric 156 are absent in the second segment and a connection portion of the auxiliary electrode extends between a plane coplanar with the first surface 101 and the buried portion 1571.

In FIG. 2D the first segments 151 include a buried portion 1571 of the auxiliary structure in a bottom section between a top section including the gate electrode 155 and the bottom of the trench structure 150. The shielding region 140 forms a continuous stripe along the complete horizontal longitudinal extension of the trench structure 150. The second segments 152 further include connection portions 1572 of the auxiliary electrode 157. The separation dielectric 156 includes a horizontal portion extending parallel to the first surface 101 in the first segments 151.

Figure 3A:
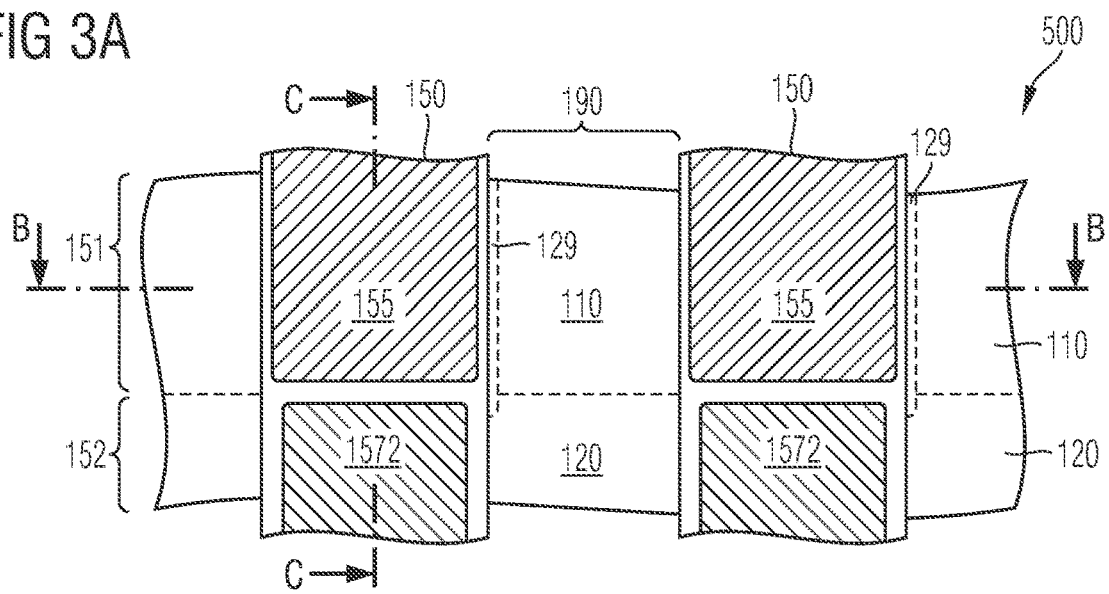
FIG. 3A is a schematic horizontal cross-sectional view of a portion of a semiconductor device with stripe-shaped trench structures according to an embodiment.
Figure 3B:
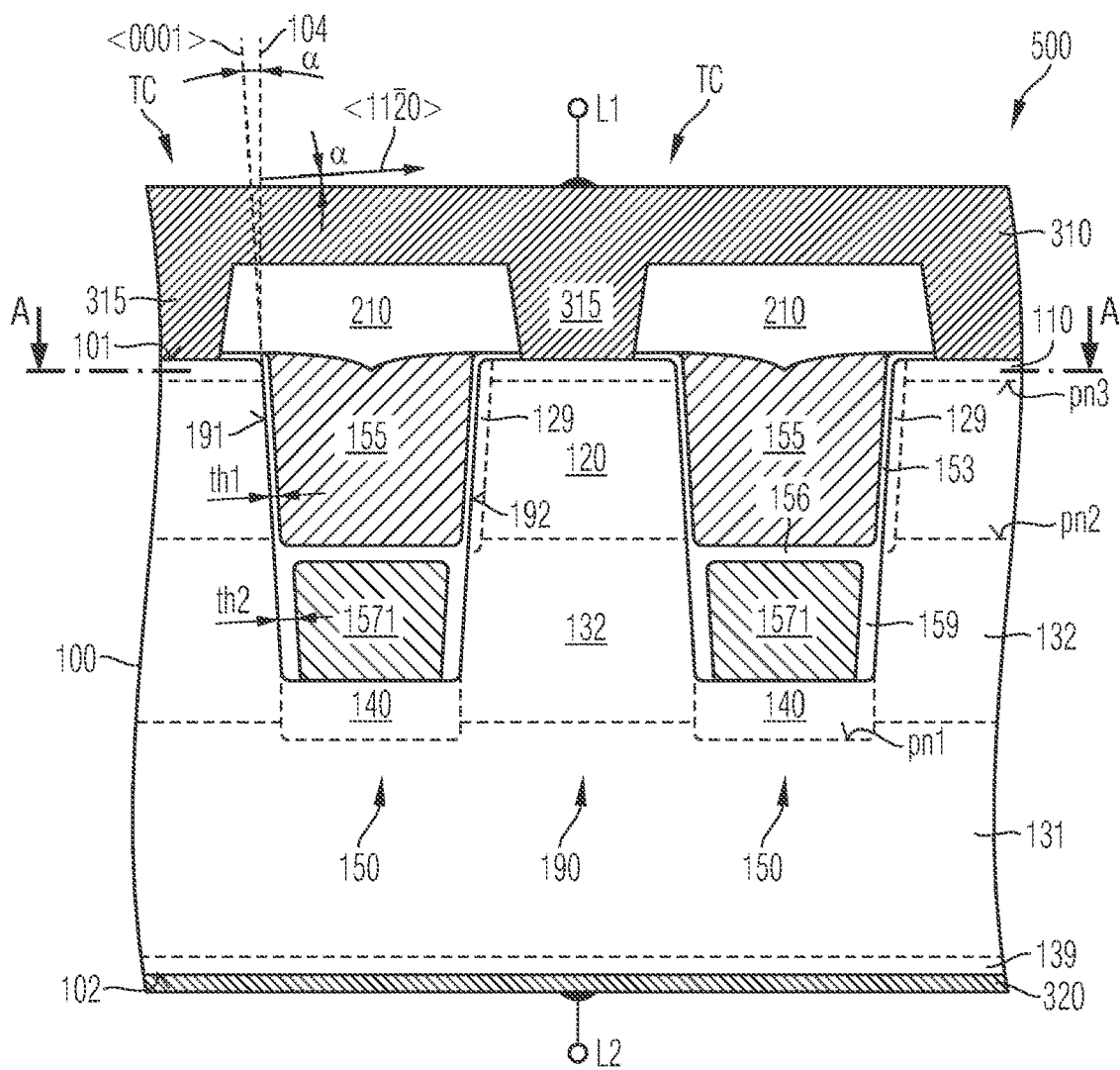
FIG. 3B is a schematic vertical cross-sectional view of the semiconductor device portion of FIG. 3A along line B-B orthogonal to a longitudinal axis of the trench structures.
Figure 3C:
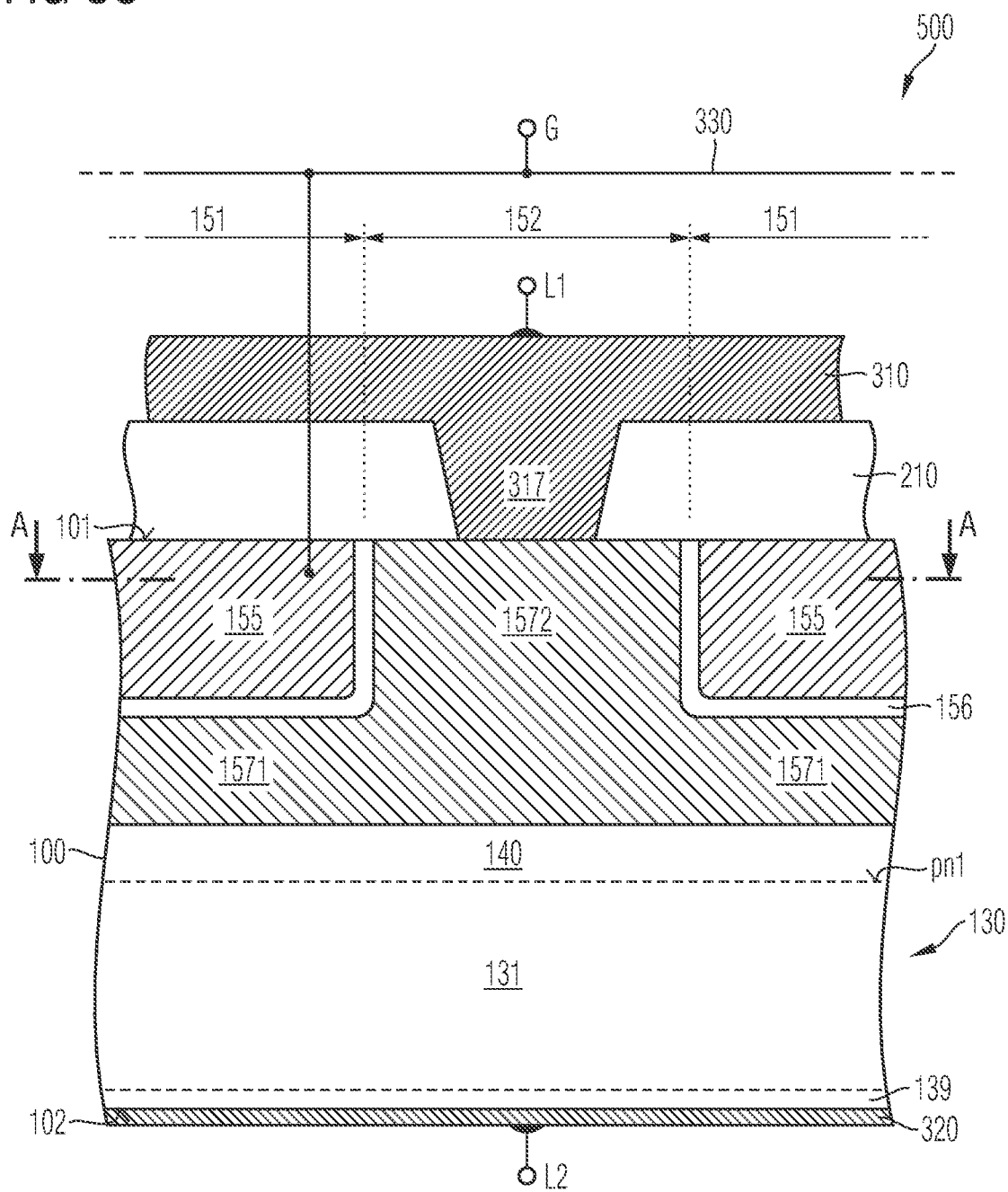
FIG. 3C is a schematic vertical cross-sectional view of the semiconductor device portion of FIG. 3A along line C-C along the longitudinal axis of a trench structure.

FIGS. 3A to 3C show a semiconductor device 500 that includes a semiconductor body 100 from a wide-bandgap semiconductor material with a hexagonal crystal lattice, for example, 2H—SiC (SiC of the 2H polytype), 6H—SiC or 15R—SiC. According to an embodiment the semiconductor material is silicon carbide of the 4H polytype (4H—SiC).

A first surface 101 at a front side of the semiconductor body 100 may coincide with a main crystal plane, wherein the first surface 101 is planar. Alternatively, an orientation of the first surface 101 may be tilted to a main crystal plane by an off-axis angle α, which absolute value may be at least 2° and at most 12°, e.g., about 4°, wherein the first surface 101 may be planar or may include parallel first surface sections shifted to each other and tilted to a horizontal mean plane by the off-axis angle α as well as second surface sections tilted to the first surface sections and connecting the first surface sections such that a cross-sectional line of the first surface 101 approximates a saw-tooth line.

Directions parallel to a planar first surface 101 or to a mean plane of a serrated first surface 101 are horizontal directions. A normal 104 to a planar first surface 101 or to a mean plane of a serrated first surface 101 defines a vertical direction.

In the illustrated embodiment, the <0001> crystal axis is tilted to the normal 104 by an off-axis angle α>0, the <11-20> crystal axis is tilted with respect to the horizontal plane by the off-axis angle α, and the <1-100> crystal axis runs orthogonal to the cross-sectional plane of FIG. 3B.

On the back of the semiconductor body 100 a second surface 102 extends parallel to the first surface 101. A distance between the first surface 101 at the front and a second surface 102 on the back positively correlates with a nominal blocking capability of the semiconductor device 500. A total thickness of the semiconductor body 100 between the first and second surfaces 101, 102 may be in the range of several hundred nm to several hundred µm.

Transistor cells TC are formed at the front side along the first surface 101. A drift structure 130 separates the transistor cells TC from the second surface 102. The drift structure 130 may include a heavily doped base portion 139 directly adjoining the second surface 102 and a lightly doped drift zone 131 between the transistor cells TC and the heavily doped base portion 139.

The heavily doped base portion 139 may be or may include a substrate portion obtained from a crystalline ingot and forms an ohmic contact with a second load electrode 320 that directly adjoins the second surface 102. A mean dopant concentration in the base portion 139 is sufficiently high to ensure an ohmic contact with the second load electrode 320. In case the semiconductor device 500 is or includes an IGFET, the base portion 139 has the same conductivity type as the drift zone 131. In case the semiconductor device 500 is an IGBT, the base portion 139 has the complementary conductivity type of the drift zone 131 or includes zones of both conductivity types.

The drift zone 131 may be formed in a layer grown by epitaxy on the base portion 139. A mean net dopant concentration in the drift zone 131 may be in the range from 1E15 cm$^{-3}$ to 5E16 cm$^{-3}$. The drift structure 130 may include further doped regions, for example field stop zones, barrier zones of the conductivity type of the drift zone 131 or counter-doped regions. In the illustrated embodiment the drift structure 130 includes current spread zones 132 directly adjoining the drift zone 131 opposite to the base portion 139. A mean dopant concentration in the current spread zones 132 is at least 150% of a mean dopant concentration in the drift zone 131, e.g. at least twice as high as in the drift zone 131.

The drift zone 131 may directly adjoin the base portion 139 or a buffer layer, which forms a unipolar homojunction with the drift zone 131, may be directly between (sandwiched between) the drift zone 131 and the base portion 139, wherein a vertical extension of the buffer layer may be approximately 1 µm and a mean dopant concentration in the buffer layer may be in a range from 3E17 cm$^{-3}$ to 1E18 cm$^{-3}$, by way of example. The buffer layer may relax mechanical stress in the semiconductor body 100, may reduce defect density and/or may contribute to shaping the electric field in the drift structure 130.

The transistor cells TC are formed along trench structures 150 that extend from the first surface 101 into the semiconductor body 100 and into the drift structure 130. Mesa portions 190 of the semiconductor body 100 laterally separate neighboring trench structures 150 from each other.

A longitudinal extension of the trench structures 150 along a first horizontal direction is greater than a width of the trench structures 150 along a second horizontal direction orthogonal to the first horizontal direction. The trench structures 150 may be long stripes extending from one side of a transistor cell region to an opposite side, wherein the length of the trench structures 150 may be up to several hundred micrometers or several millimeters. According to other embodiments a plurality of separated trench structures 150 may be formed along a line extending from one side of the transistor cell region to the opposite side. The bottom of the trench structures 150 may be edged or rounded.

The trench structures 150 may be equally spaced, may have equal width, and may form a regular pattern, wherein a pitch (center-to-center distance) of the trench structures 150 may be in a range from 1 µm to 10 µm, e.g., from 2 µm to 5 µm. A vertical extension of the trench structures 150 may be in a range from 0.3 µm to 5 µm, e.g., in a range from 0.5 µm to 2 µm.

Sidewalls at the long sides of the trench structures 150 may be vertical to the first surface 101, slanted to the normal 104, or may taper with increasing distance to the first surface 101. For example, a taper angle of the trench structures 150 with respect to the vertical direction may be equal to the off-axis angle α or may deviate from the off-axis angle α by not more than ±1 degree such that at least a first mesa sidewall 191 of two opposite longitudinal mesa sidewalls is formed in a main crystal plane with high charge carrier mobility, e.g., a {11-20} crystal plane.

A second mesa sidewall 192 opposite to the first mesa sidewall 191 may be tilted to a main crystal plane by twice the off-axis angle α, e.g., by 4 degrees or more, for example, by about 8 degrees. The first and second mesa sidewalls 191, 192 are on opposite longitudinal sides of the intermediate mesa portion 190 and directly adjoin two neighboring trench structures 150.

Each mesa portion 190 may include one source zone 110 with interconnected sections or may include two or more source zones 110 separated from each other within the mesa portion 190 but electrically connected to each other through a low impedance path through a mesa contact structure 315 that directly adjoins the mesa portions 190. The source zones 110 directly adjoin at least the first mesa sidewall 191 and may directly adjoin the second mesa sidewall 192 or may be spaced apart from the second mesa sidewall 192.

The mesa portions 190 further include body regions 120 that separate the source zones 110 from the drift structure 130, wherein the body regions 120 form second pn junctions pn2 with the drift structure 130 and third pn junctions pn3 with the source zones 110. The body regions 120 directly adjoin at least the first mesa sidewall 191 and may directly adjoin the second mesa sidewall 192 or may be spaced apart from the second mesa sidewall 192. A vertical extension of the body regions 120 corresponds to a channel length of the transistor cells TC and may be in a range from 0.2 µm to 1.5 µm. Passivation zones 129 forming unipolar junctions with the body region 120 may be formed along the second mesa sidewalls 192.

The mesa contact structures 315 extend through an interlayer dielectric 210 and electrically connect the source zones 110 and the body regions 120 with a first load electrode 310 at the front side. The mesa contact structures 315 may end on the first surface 101 and may alternatingly be in direct contact with source zones 110 and with body regions 120 along the horizontal longitudinal direction of the mesa portion 190. For example, source zones 110 may be formed predominantly or exclusively along first segments 151 and body regions 120 may directly adjoin the first surface 101 predominantly or exclusively along the second segments 152.

The first load electrode 310 may form or may be electrically connected or coupled to a first load terminal L1, which may be effective as an anode terminal of an MCD, as source terminal of an IGFET or as emitter terminal of an IGBT.

A second load electrode 320 directly adjoins the second surface 102 and the base portion 139 of the drift structure 130. The second load electrode 320 at the rear side may form or may be electrically connected or coupled to a second load terminal L2, which may be effective as cathode terminal of an MCD, as drain terminal of an IGFET or as collector terminal of an IGBT.

A shielding region 140 may be formed along the bottom of the trench structure 150, e.g., may directly adjoin the bottom of the trench structure 150. The shielding region 140 forms a first pn junction pn1 with the drift structure 130, for example, with the drift zone 131. The shielding region 140 may be symmetric with respect to a vertical center axis of the trench structure 150. The shielding region 140 may be completely within the vertical projection of the trench structure 150 or may be formed only in a central portion of the vertical projection of the trench structure 150. A mean dopant concentration in the shielding region 140 may be in a range from 1E17 cm$^{-3}$ to 2E19 cm$^{-3}$, for example from 8E17 cm$^{-3}$ to 8E18 cm$^{-3}$.

The trench structures 150 include a conductive gate electrode 155 which may include or consist of a heavily doped, e.g., p-doped polycrystalline silicon and/or a metal-containing layer. The gate electrode 155 may be electrically connected to a gate metallization that forms or that is electrically connected or coupled to a gate terminal.

A gate dielectric 153 separates the gate electrode 155 from the semiconductor body 100 along at least the first mesa sidewall 191. The gate dielectric 153 may include or consist of a semiconductor dielectric, for example thermally grown or deposited semiconductor oxide, e.g., silicon oxide, a semiconductor nitride, for example deposited or thermally grown silicon nitride, a semiconductor oxynitride, for example silicon oxynitride, any other deposited dielectric material or any combination thereof. According to an embodiment the gate dielectric 153 is based on a silicon oxide densified and partly nitridized after deposition. The gate dielectric 153 may be formed for a threshold voltage of the transistor cells TC in a range from 1.0 V to 8 V.

The trench structures 150 further include an auxiliary electrode 157 that forms a low-resistive interface with the shielding regions 140. For example, the auxiliary electrode 157 is in ohmic contact, in particular a low-ohmic contact, with the shielding region 140. According to an embodiment the auxiliary electrode 157 may directly adjoin the shielding region 140. An interface between the auxiliary electrode 157 and the shielding region 140 at the bottom of the trench may be parallel to the first surface 101. The auxiliary electrode 157 may include or consist of heavily doped, e.g., p-doped polycrystalline silicon and/or a metal-containing layer.

The auxiliary electrode 157 is electrically connected to a potential different from a potential of the gate terminal G and from the second load terminal L2. According to an embodiment, the auxiliary electrode 157 is electrically connected to the first load terminal L1, to an auxiliary terminal or to an internal network node.

A separation dielectric 156 separates the auxiliary electrode 157 from the gate electrode 155. A field dielectric 159 may laterally separate the auxiliary electrode 157 from the drift structure 130. The field dielectric 159 may be formed along the sidewalls of the trench structures 150 and may have an opening at the trench bottom. In one example, the field dielectric 159 is formed exclusively along the sidewalls of the trench structures 150 and the opening may have the size of the entire trench bottom. According to another embodiment, the field dielectric 159 may include a portion extending along the trench bottom, wherein the remaining opening is smaller than the entire trench bottom.

A thickness th2 of the field dielectric 159 may be greater than a thickness th1 of the gate dielectric 153. For example, the thickness th2 of the field dielectric 159 may be at least 120%, e.g., at least 150% of the thickness th1 of the gate dielectric 153.

The separation dielectric 156 and the field dielectric 159 may have a same configuration and/or may include the same materials or may have different configurations and/or may include different materials. For example, the separation dielectric 156 and the field dielectric 159 may include deposited silicon oxide, silicon nitride, silicon oxynitride, any other deposited dielectric material or any combination thereof. Alternatively or in addition to deposited layers the field dielectric 159 may include thermally grown silicon oxide or silicon oxynitride. The dielectric breakdown voltage of the field dielectric 159 is significantly higher than that of the gate dielectric 153.

In first segments 151 of the trench structures 150 the gate electrode 155 is formed between a buried portion 1571 of the auxiliary electrode 157 and a plane coplanar with the first surface 101. The gate electrode 155 spaces the buried portion 1571 apart from the first surface 101, wherein the gate electrode 155 completely fills a top section of the trench structure 150 in the first segments 151 and extends from a portion of the gate dielectric 153 at a first trench sidewall, which extends parallel to a longitudinal direction of the trench structure 150, to a portion of the gate dielectric 153 at the opposite trench sidewall. The buried portion 1571 of the auxiliary electrode 157 completely fills a bottom portion of the trench structure 150 and extends from a portion of the field dielectric 159 on the first trench sidewall of the trench structure 150 to a portion of the field dielectric 159 on the opposite trench sidewall.

In second segments 152 of the trench structures 150 the gate electrode 155 is absent and the auxiliary electrode 157 is directly connected with the first load electrode through a vertical path.

According to an embodiment a connection portion 1572 of the auxiliary electrode 157 may extend between the buried portion 1571 and the first surface 101, wherein an auxiliary contact structure 317 electrically connects the connection portion 1572 with the first load electrode 310. The connection portion 1572 may completely fill the top section of the second segments 152 and may extend from a portion of the field dielectric 159 on the first trench sidewall of the trench structure 150 to a portion of the field dielectric 159 on the second, opposite trench sidewall.

The second segments 152 may alternate with the first segments 151 along the horizontal longitudinal direction of the trench structure 150, wherein the horizontal longitudinal direction is parallel to the first surface 101. Along the horizontal longitudinal direction, a length ratio of first segments 151 with gate electrode 155 to second segments 152 without gate electrode 155 may be at least 5:1, e.g., at least 10:1.

In the on-state, the passivation zones 129 may suppress channel formation along the second mesa sidewalls 192, along which charge carrier mobility may be significantly lower than along the first mesa sidewalls 191. In the on-state, a load current exclusively flows along the first mesa sidewalls 191.

In the blocking mode a depletion zone extending along the first pn junction pn1 laterally extends into the current spread zones 132 and shields the gate dielectric 153 against the high voltage applied at the second load terminal L2 such that the electric field strength in the gate dielectric 153 does not exceed 3.5 MV/cm, e.g., does not exceed 3 MV/cm. Electrically connecting the shielding region 140 through the auxiliary electrode 157 at the bottom of the trench structures 150 drains off charge carriers, e.g., holes from the n-doped drift zone 131 passing the first pn junctions pn1 in case of an avalanche breakdown at high efficiency compared to p-doped regions in the mesa portion 190 of a comparative example. The distance between neighboring trench structures 150 can therefore be reduced such that the effective transistor area is increased.

The voltage breakdown is pinned along the shielding region 140 and the resulting breakdown current can be accommodated by a conductive material with better conductivity than doped single-crystalline silicon carbide. The absence of any charge carrier flow through the mesa portions 190 in the avalanche case completely suppresses the turning-on of a parasitic npn bipolar junction transistor formed by the n-doped source zone 110, the p-doped body region 120 and the n-doped drift structure 130.

The placement of the shielding region 140 in the vertical projection of the trench structure 150 facilitates the formation of the shielding region 140 by an implant through the bottom of an open trench. As a consequence, deep shielding regions 140 can be formed at comparatively low acceleration energies. Deep shielding regions 140 in combination with more heavily doped current spread zones 132 may result in a lateral compensation structure that facilitates further reduction of the on-state resistance.

The connection portions 1572 intersect the gate electrode 155 in the trench structures 150 into separated gate portions, which are insulated from the connection portions 1572 by the separation dielectric 156. The separated gate portions in the trench structures 150 may be electrically connected to each other in a metallization layer including gate connection lines and embedded in an interlayer dielectric 210, which separates the first load electrode 310 from the semiconductor body 100. According to an embodiment, the separated gate portions of the gate electrode 155 in the trench structures 150 may be electrically connected through a gate conductor structure 158 of the material of the gate electrode 155, wherein the gate conductor structure 158 is formed in a plane between the first load electrode 310 and the first surface 101.

FIGS. 4A to 4E refer to an embodiment with a gate conductor structure 158 electrically connecting separated gate portions of the gate electrode 155. The gate conductor structure 158 may be arranged on or above the first surface 101.

Figure 4A:
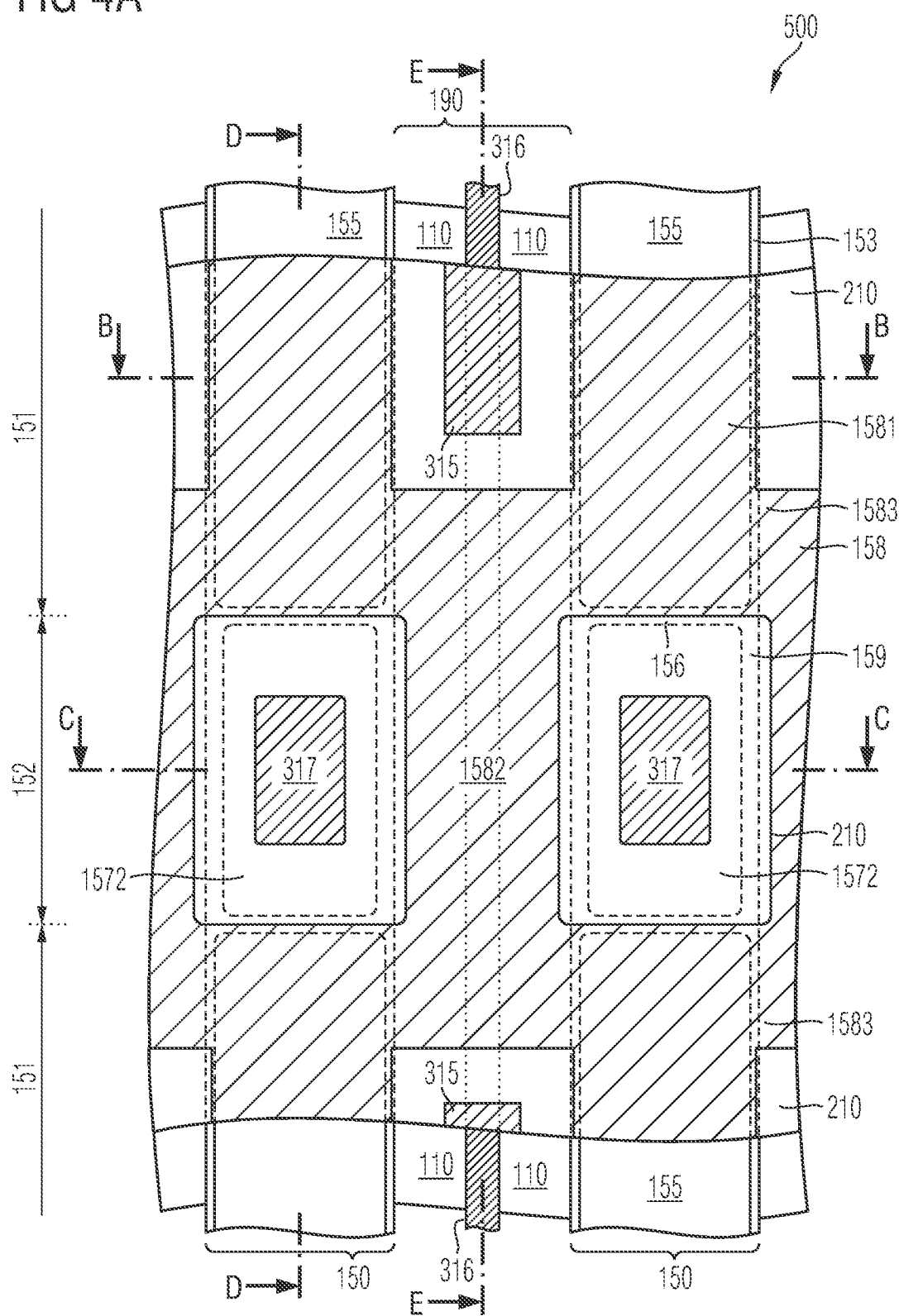
FIG. 4A is a schematic plan view of a portion of a semiconductor device according to an embodiment concerning a gate conductor structure connecting separated gate electrode portions.

FIG. 4A shows the gate conductor structure 158 including first connection portions 1581 in the vertical projection of the gate electrode 155 in the first segments 151, second connection portions 1582 extending parallel to the second segments 152 in the vertical projection of the mesa portions 190 between neighboring second segments 152. The first and second connections portions 1581, 1582 may adjoin to each other. According to the illustrated embodiment third connection portions 1583 laterally connect the first and second connection portions 1581, 1582. The first connection portions 1581 may be directly above and connected to the gate electrode 155 in the first segments 151. The second connection portions 158 may be above and spaced apart from the mesa portions 190. The gate conductor structure 158 may form a grid with openings for the isolated auxiliary contact structures 317 and for the mesa contact structures 315.

Figure 4B:
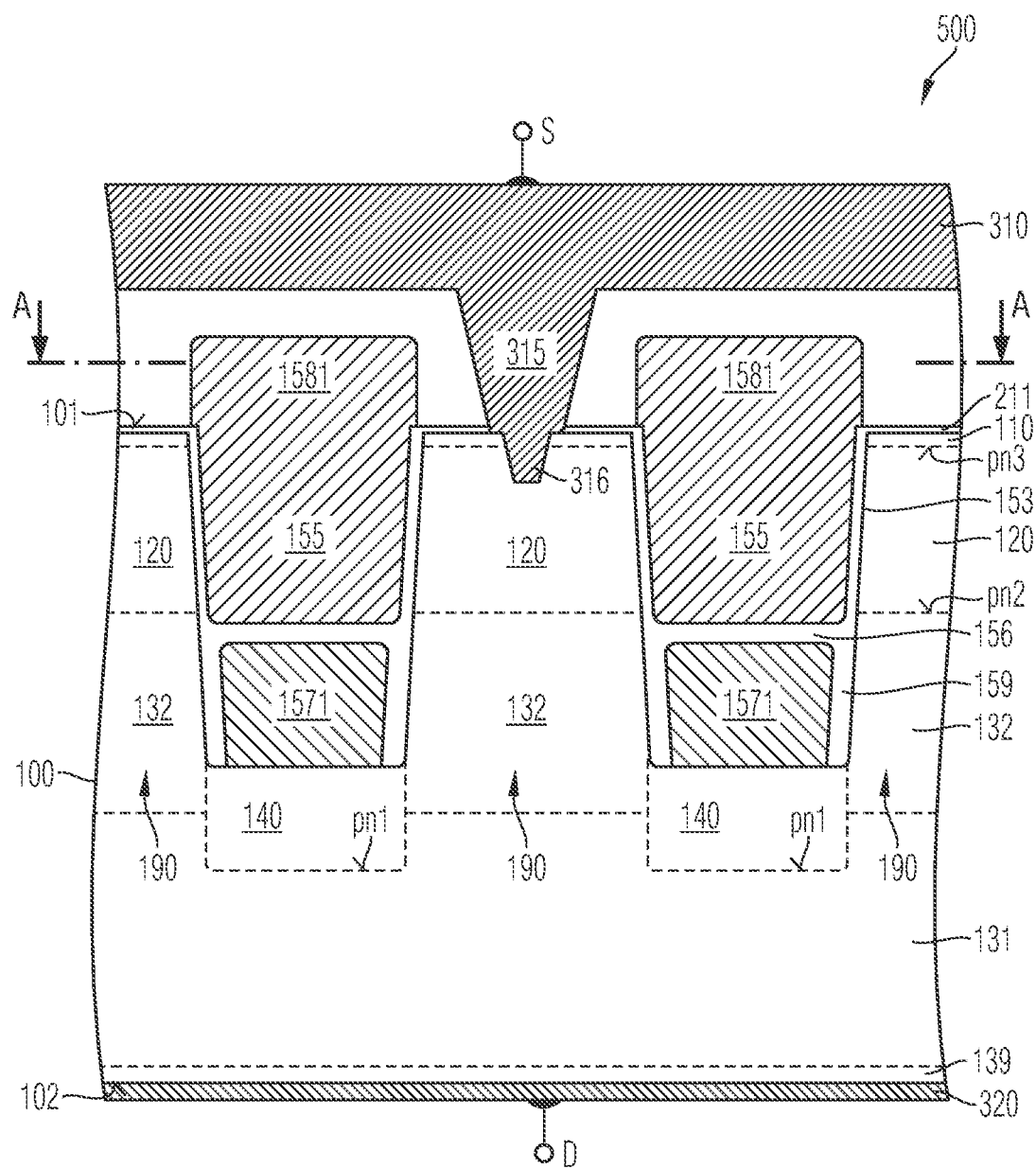
FIG. 4B is a schematic vertical cross-sectional view of the semiconductor device portion of FIG. 4A along line B-B orthogonal to a longitudinal axis of trench structures.

As illustrated in FIG. 4B the first connection portions 1581 of the gate conductor structure 158 are in a vertical projection of the gate electrode 155. A source contact plug 316 from a highly conductive material, for example, a metal-containing material may be formed along a longitudinal center axis of the mesa portion 190 and may directly adjoin the mesa contact structure 315.

The source contact plug 316 extends through the source zone 110 into the body region 120. Since even in the avalanche case almost no charge carriers are drained off from the body regions 120, the source contact plug 316 may be matched to provide a low-ohmic connection to the source zones 110. For example, the source contact plug 316 may be formed without aluminum (Al). For example, a source contact plug 316 from nickel (Ni) or including a combination of a thin nickel silicide (NiSi) layer and a reinforcement portion of, e.g., tungsten (W) provides a low-ohmic contact to the source zones 110 and sufficient high conductivity for preventing the body regions 120 from floating.

Figure 4C:
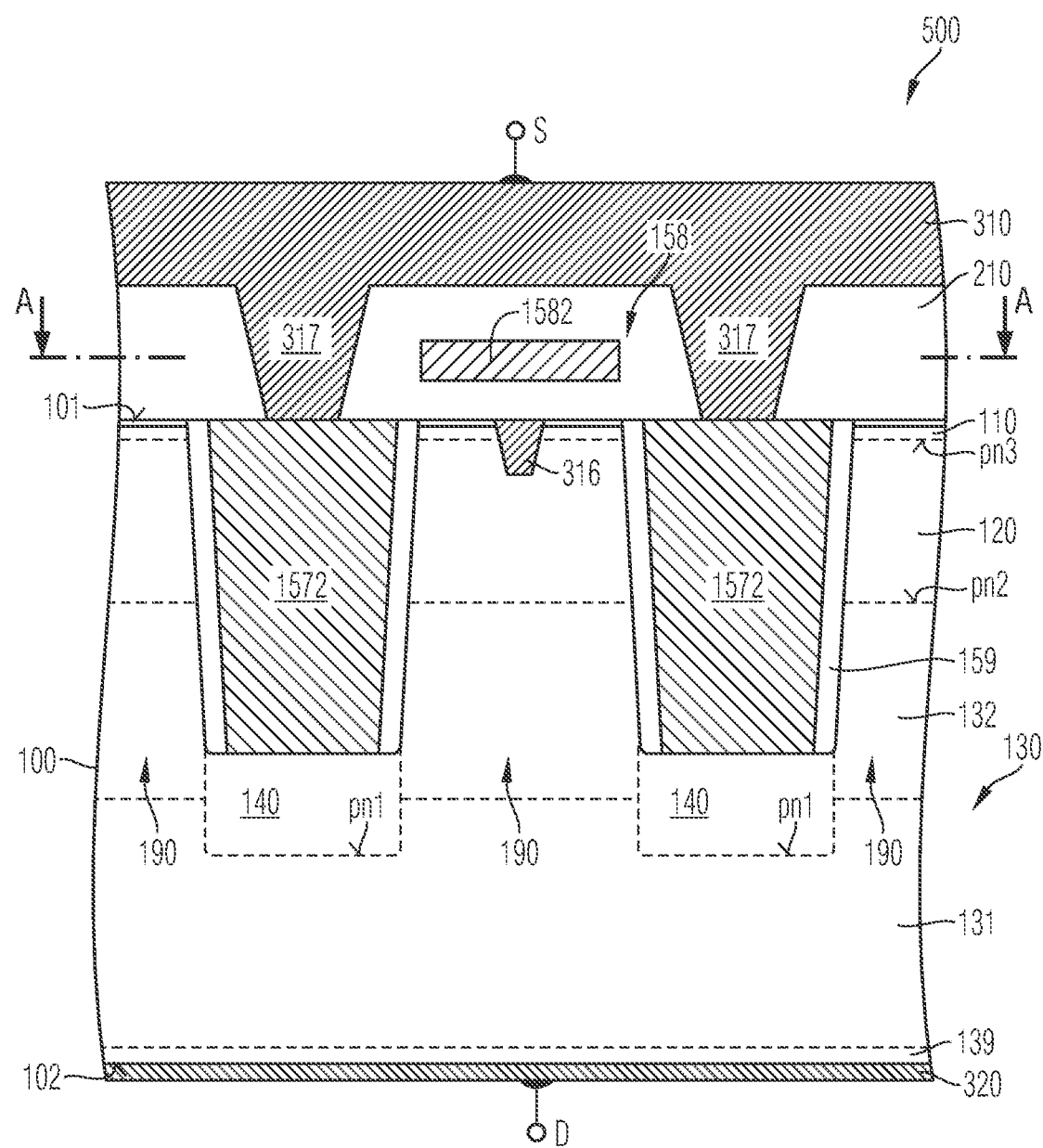
FIG. 4C is a schematic vertical cross-sectional view of the semiconductor device portion of FIG. 4A along line C-C orthogonal to a longitudinal axis of trench structures.

FIG. 4C shows that the second connection portions 1582 of the gate conductor structure 158 are in a vertical projection of the mesa portion 190. The source contact plug 316 may be formed also in the vertical projection of the second connection portion 1582.

Figure 4D:
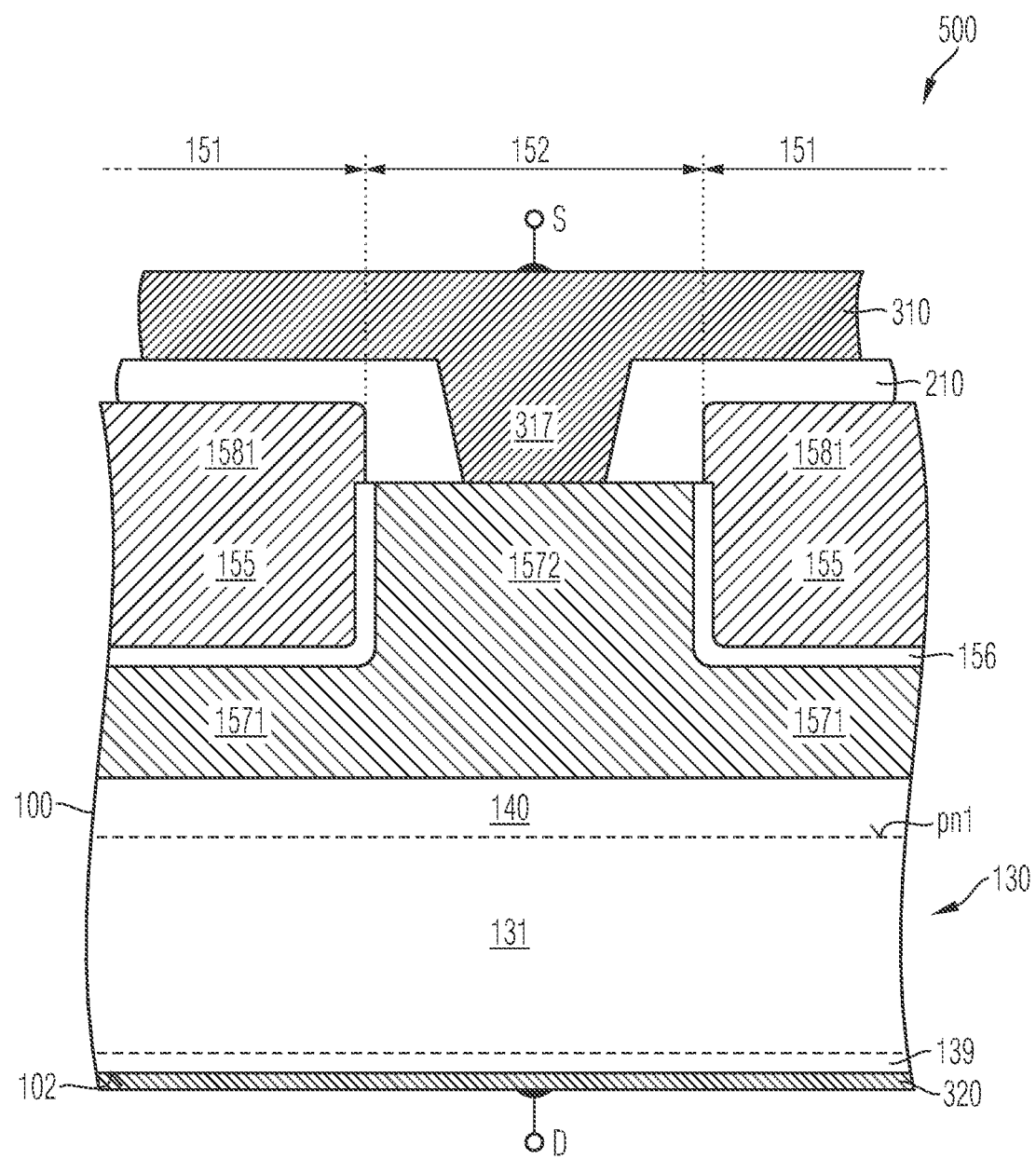
FIG. 4D is a schematic vertical cross-sectional view of the semiconductor device portion of FIG. 4A along line D-D along the longitudinal axis of a trench electrode structure.

According to FIG. 4D the auxiliary contact structure 317 electrically connects the connection portion 1572 of the auxiliary electrode 157 in the second segments 152 with the first load electrode 310. The separation dielectric 156 includes a vertical portion laterally separating the connection portion 1572 of the auxiliary electrode 157 from the gate electrode 155.

Figure 4E:
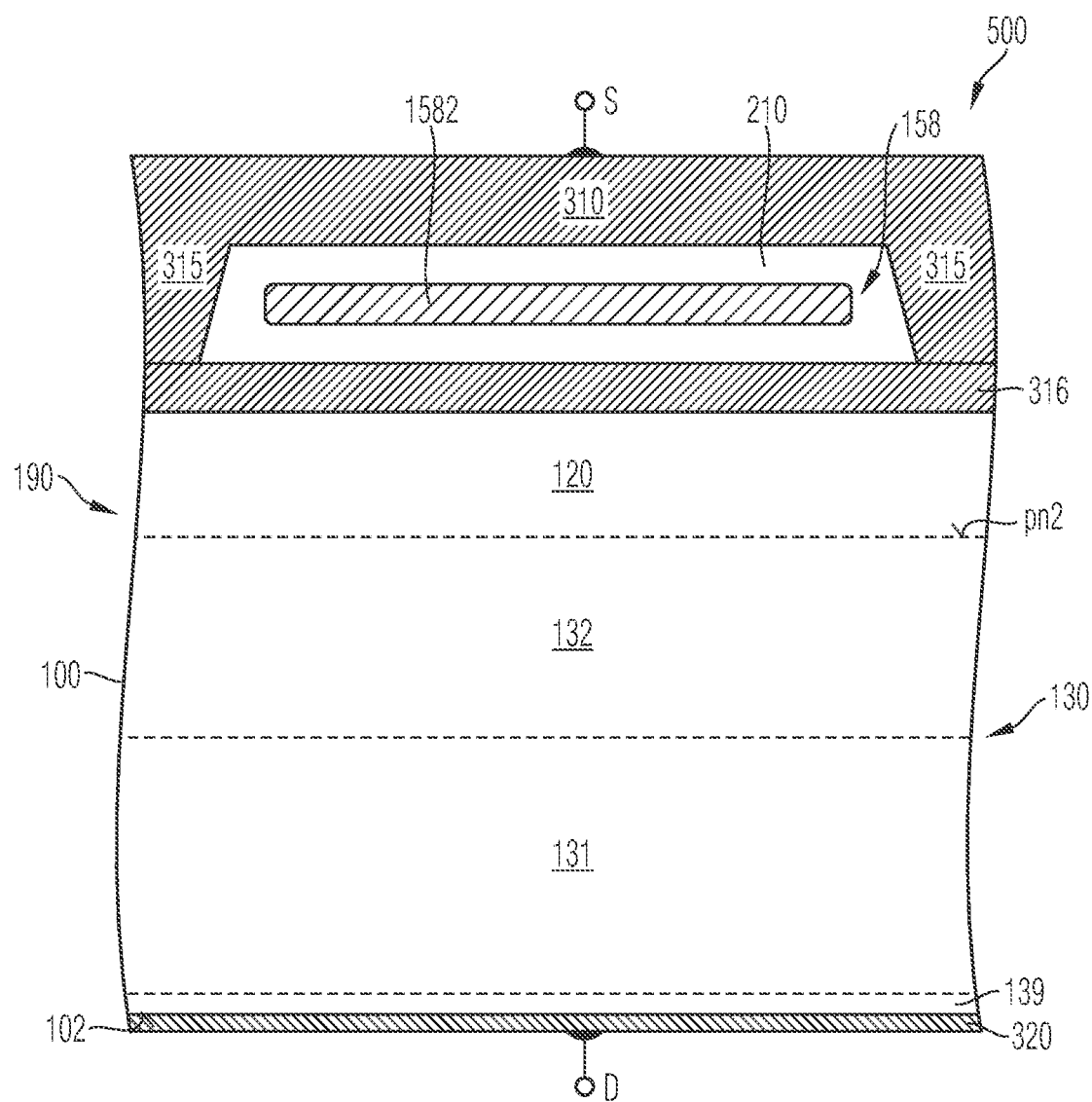
FIG. 4E is a schematic vertical cross-sectional view of the semiconductor device portion of FIG. 4A along line E-E along the longitudinal axis of a mesa portion.

FIG. 4E shows a complete longitudinal extension of the second connection portion 1582 of the gate conductor structure 158. The buried source contact plug 316 is formed continuously and without gaps along the longitudinal direction of the mesa portion 190.

In a 4H—SiC semiconductor body 100 with a crystal orientation as illustrated in FIGS. 3A and 3B, the first mesa sidewall 191 may exhibit significant higher charge carrier mobility than the second mesa sidewall 192. Formation of an inversion channel through the body region 120 along the second mesa sidewall 192 may be suppressed in order to achieve a uniform threshold voltage, in case where the trench direction is perpendicular to the off-orientation direction of the first surface 101. For example, all source zones 110 are spaced from the second mesa sidewall 192, the dopant concentration in a portion of the body region 120 directly adjoining the second mesa sidewall 192 may be significantly increased, e.g., by a passivation zone 129 shown in FIG. 3B, or a thickness of the gate dielectric 153 may be significantly greater along the second mesa sidewall 192 than along first mesa sidewall 191.

Figure 5A:
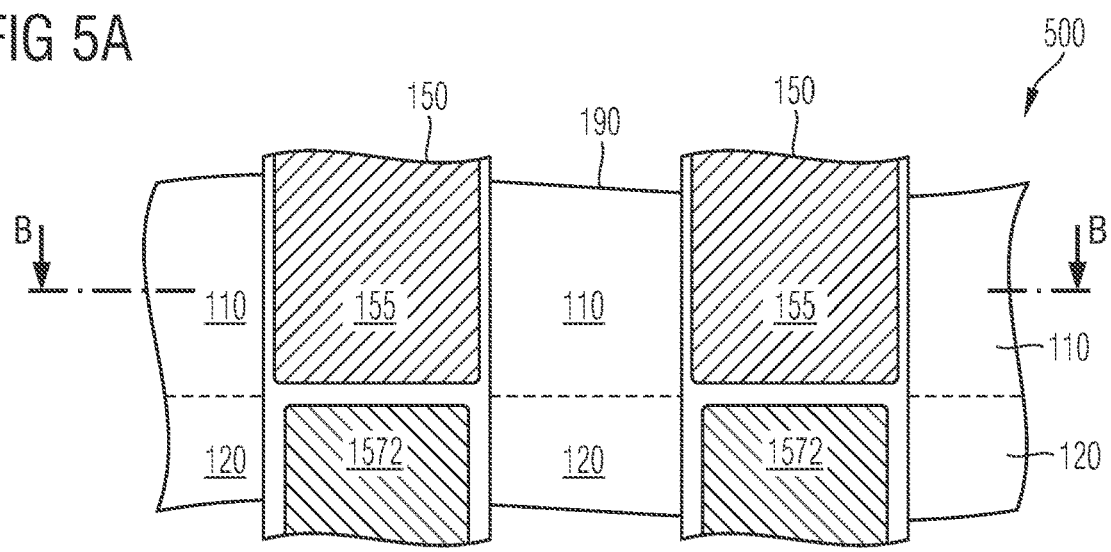
FIG. 5A is a schematic plan view of a portion of a semiconductor device according to an embodiment concerning trench structures with parallel sidewalls tilted to a normal.
Figure 5B:
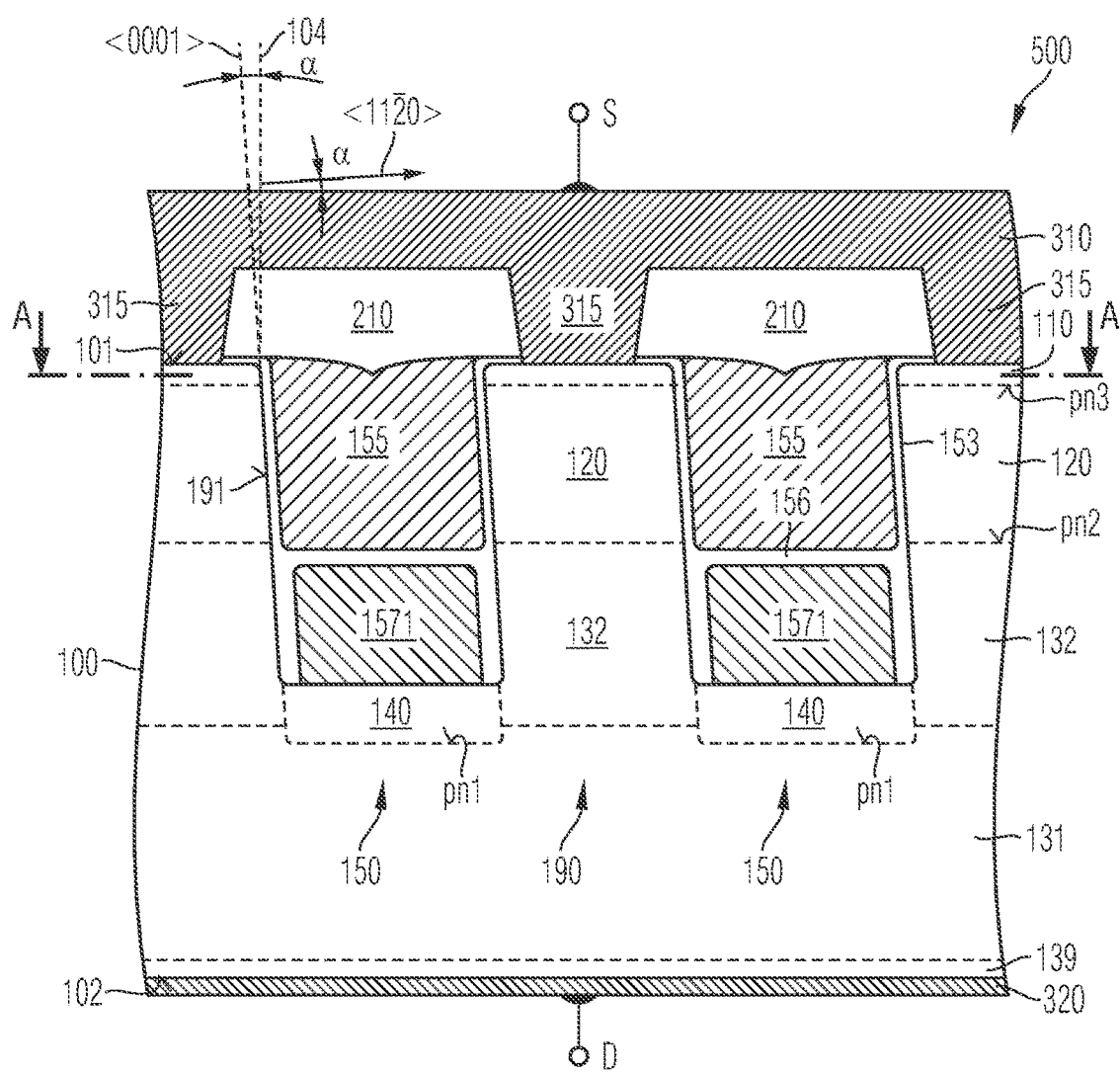
FIG. 5B is a schematic vertical cross-sectional view of the semiconductor device portion of FIG. 5A along line B-B orthogonal to a longitudinal axis of the trench structures.

In FIGS. 5A and 5B the second mesa sidewall 192 is parallel to the first mesa sidewall 191 and both mesa sidewalls 191, 192 are tilted to the normal 104 by the off-axis angle α such that charge carrier mobility is approximately equal along the first and second mesa sidewalls 191, 192. For example, the trench structures 150 of FIGS. 5A to 5B may be formed using directed ion beam etching, wherein the directed ion beam impinges at an angle tilted to the normal 104 by the off-axis angle α.

Figure 6A:
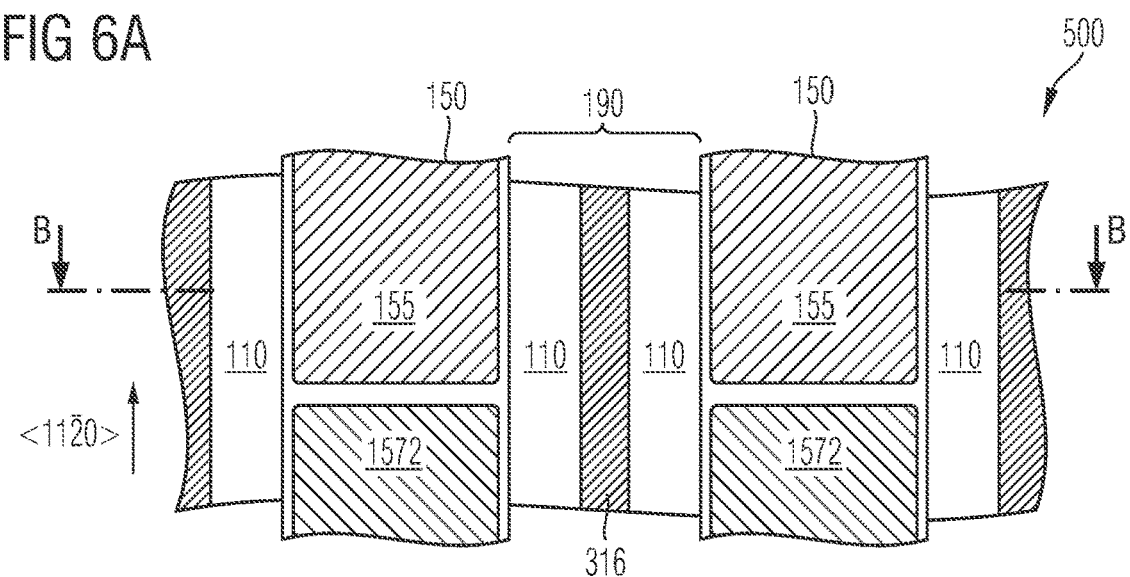
FIG. 6A is a schematic plan view of a portion of a semiconductor device according to an embodiment concerning trench structures with parallel vertical sidewalls and longitudinal axes parallel to the <11-20> crystal axis.
Figure 6B:
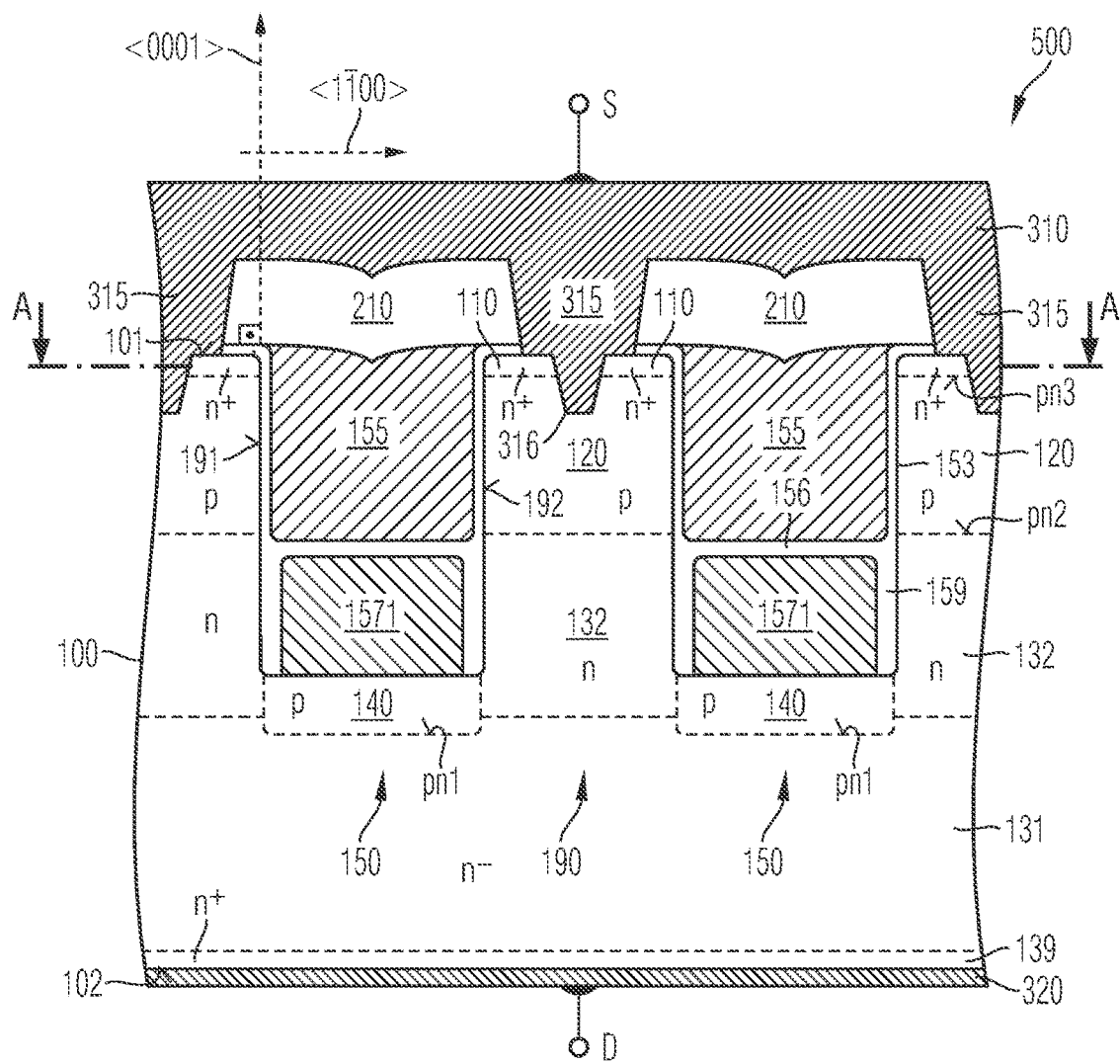
FIG. 6B is a schematic vertical cross-sectional view of the semiconductor device portion of FIG. 6A along line B-B orthogonal to a longitudinal axis of the trench structures.

In FIGS. 6A and 6B the semiconductor device 500 is an re-channel field effect transistor with p-doped body regions 120. The <0001> main crystal axis is tilted to the normal 104 by an off-axis angle α into direction of the (11-20) main crystal plane. Horizontal longitudinal axes of the trench structures 150 are in the vertical plane of the <11-20> crystal direction and vertical first and second mesa sidewalls 191, 192 are (-1100) and (1-100) crystal planes. The charge carrier mobility in both crystal planes is approximately equal such that use of both the first and the second mesa sidewalls 191, 192 overcompensates for the lower charge carrier mobility with respect to the (11-20) crystal plane.

Figure 7A:
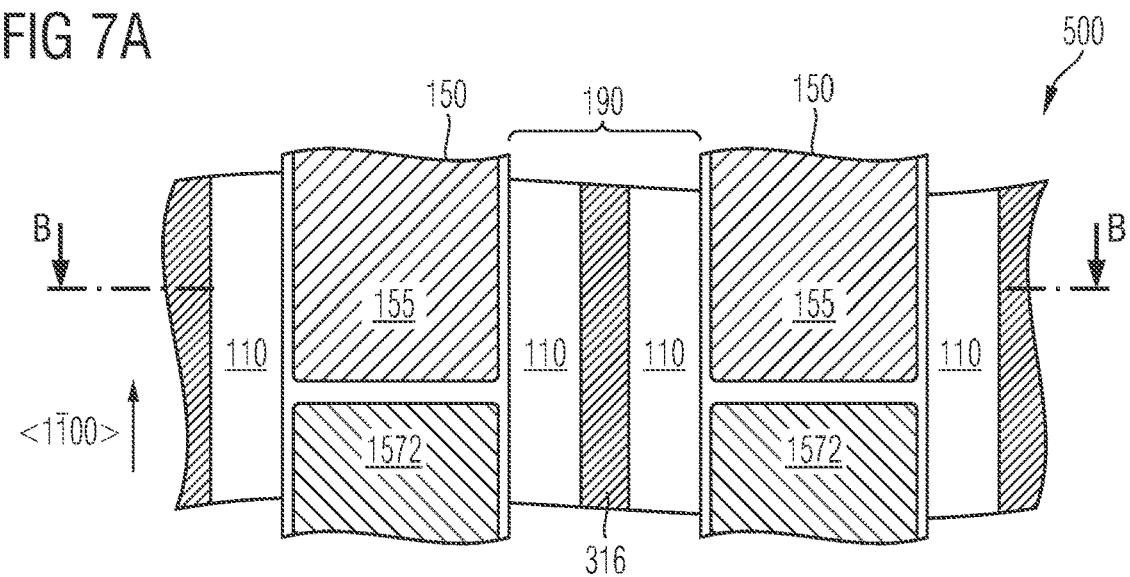
FIG. 7A is a schematic plan view of a portion of a semiconductor device according to an embodiment concerning trench structures with parallel vertical sidewalls and longitudinal axes parallel to the <1-100> crystal axis.
Figure 7B:
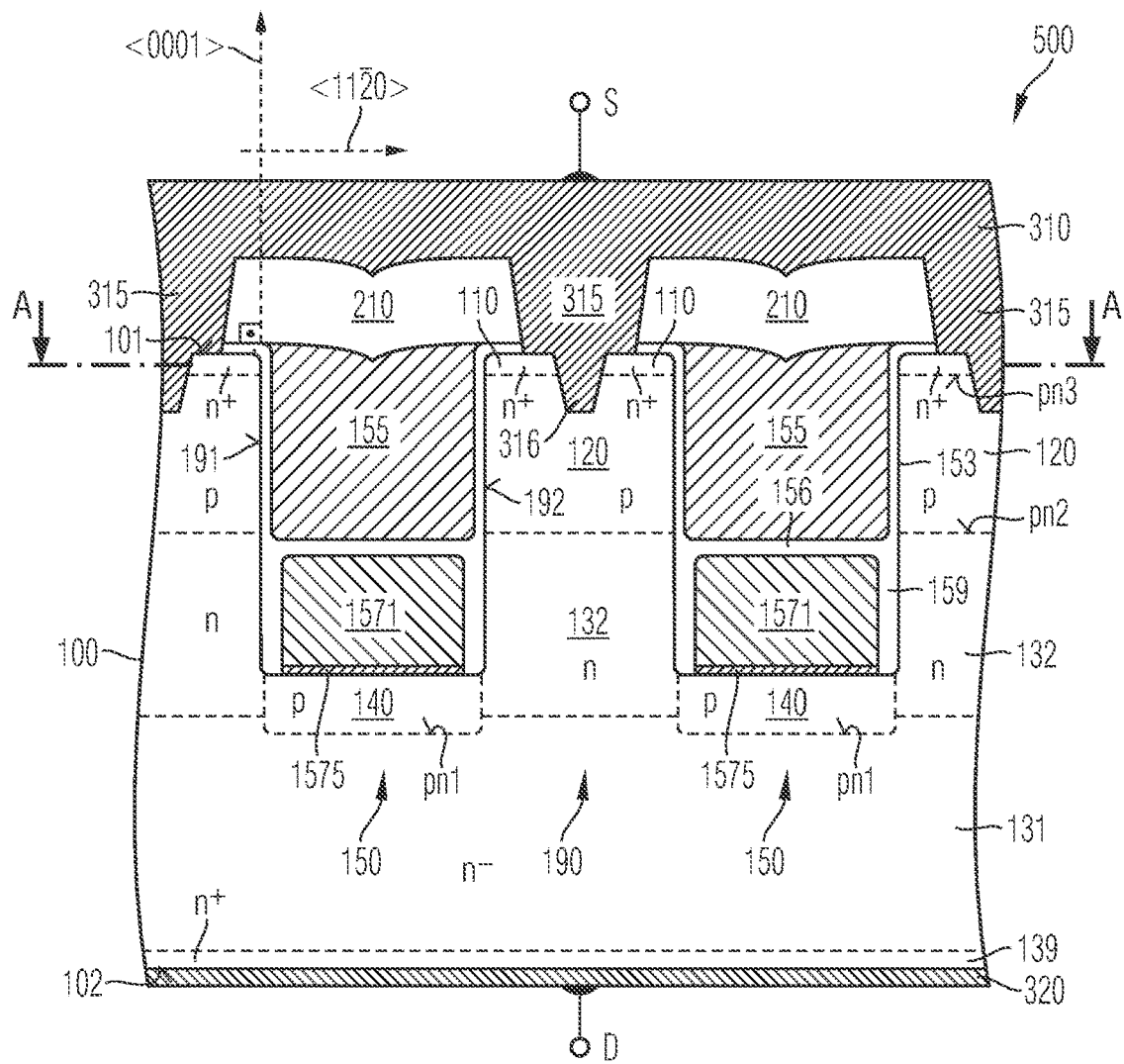
FIG. 7B is a schematic vertical cross-sectional view of the semiconductor device portion of FIG. 7A along line B-B orthogonal to a longitudinal axis of the trench structures.

In FIGS. 7A and 7B the semiconductor device 500 is another n-channel field effect transistor with the <0001> main crystal axis tilted by the off-axis angle α into direction of the <1-100> crystal axis. The longitudinal axes of the trench structures 150 are parallel to the <1-100> crystal direction and vertical first and second mesa sidewalls 191, 192 are (11-20) and (-1-120) crystal planes with approximately the same charge carrier mobility.

In FIG. 7B the auxiliary electrode 157 includes an interface layer 1575. The interface layer 1575 forms part of a low-resistive contact, e.g., an ohmic contact with the shielding region 140. For example, the interface layer 1575 may directly adjoin the shielding region 140. The interface layer 1575 may have a thickness of at least 5 nm, for example at least 10 nm and may contain at least one metal, for example aluminum. According to an embodiment, the interface layer 1575 includes a layer of aluminum nitride or aluminum titanium. A further portion of the auxiliary electrode 157 may be of heavily doped, e.g., p-doped polycrystalline silicon, by way of example.

In FIGS. 8A and 8B the cross-sections along lines B-B and B'-B' may be identical or may differ from each other in one or more details, e.g., with respect to lateral dimensions and with respect to the presence or absence of portions of a source zone 110.

A trench structure 150 extends from a first surface 101 at a front side of a silicon carbide body 100 into said silicon carbide body 100. The trench structure 150 forms a grid that includes a first set of first stripe portions 161 intersecting a second set of second stripe portions 162. The stripe portions 161, 162 of a set may run parallel to each other or a set may include non-parallel symmetric pairs of stripe portions, wherein stripe portions of a symmetric pair are symmetric to each other with respect to an intermediate center axis.

The first stripe portions 161 may intersect the second stripe portions 162 at regular distances. The stripe portions 161, 162 may be straight or may be meandering, wherein a meandering stripe portion 161, 162 may include a repetitive sequence of bends.

According to the illustrated embodiment the first stripe portions 161 are straight and parallel to each other and orthogonally intersect straight second stripe portions 162 running parallel to each other.

The trench structure 150 may include an auxiliary electrode 157 and a gate electrode 155, wherein the gate electrode 155 may be arranged along the vertical direction between the auxiliary electrode 157 and a plane spanned by the first surface 101. A shielding region 140 may directly adjoin the auxiliary electrode 157 at a bottom of the trench structure 150. The shielding region 140 may form a low-ohmic contact with the auxiliary electrode 157 and may form a first pn junction pn1 with a drift structure 130 in the silicon carbide body 100.

The drift structure 130 may be formed between the trench structure 150 and a second surface 102 at a rear side of the silicon carbide body 100 and may include a low doped drift zone 131.

Between two neighboring first stripe-shaped portions 161 and two neighboring second stripe-shaped portions 162 of the trench 150 a mesa portion 190 of the silicon carbide body 100 is formed. A horizontal cross-section of the mesa portion 190 may be a rectangle, for example a square, a rhombus, a hexagon or an octagon, by way of example. Edges of the horizontal cross-section may be sharp, chamfered or rounded.

In the mesa portion 190 a body region 120 may extend across a complete horizontal cross-section of the mesa portion 190. The body region 120 forms a second pn junction pn2 with the drift structure 130, e.g., with a low-doped drift zone 131 or with a current spread zone. The body region 120 forms a third pn junction pn3 with a source zone 110.

The source zone 110 may be formed between the body region 120 and the first surface 101. The source zone 110 and a heavily doped contact portion 128 of the body region 120 may be stripe-shaped and may be formed side-by-side along a top surface 191 of the mesa portion 190 such that the mesa portion 190 may be formed with a small horizontal cross-sectional area.

According to another embodiment the source zone 110 may extend along the complete circumference of the mesa portion 190 and may completely surround the contact portion 128 along the top surface 191, wherein an inversion channel formed in the body region 120 may be directly connected to the source zone 110 along the complete circumference of the mesa portion 190.

The contact portion 128 may extend from the first surface 101 to a main portion 125 of the body zone 120, wherein the contact portion 128 may have a higher dopant concentration than the main portion 125 and wherein the main portion 125 separates the contact portion 128 from the trench structure 150, from the drift structure 130 or from both. For example, a maximum dopant concentration in the contact portion 128 may be at least twice as high as in the main portion 125.

A gate dielectric 153 may be formed along a complete circumference of an upper section of the mesa portion 190, wherein the upper section includes the body region 120. The gate dielectric 153 may be formed from silicon oxide or may include silicon oxide and/or a dielectric material with a dielectric constant greater 3.9.

In the on-state of the semiconductor device 500, the inversion channel may form on more than two sides of the mesa portion 190, e.g., on three sides or along the complete circumference of the mesa portion 190, wherein an effective total channel width per area unit may be greater than for stripe-shaped mesa portions. The greater total channel width reduces the on-state resistance RDSon.

A field dielectric 159 may laterally separate the auxiliary electrode 157 from the drift structure 130. The field dielectric 157 may be formed to withstand the maximum electric field strength occurring along the trench structure 150 and may be thicker than the gate dielectric 153 and/or may include materials with a lower dielectric constant than the material of the gate dielectric 153, e.g., lower than 3.9. For example, the field dielectric 159 may include or consist of silicon nitride $Si_3N_4$.

A first load electrode 310 may directly adjoin the top surface 191 of the mesa portion 190. Since silicon carbide shows a higher bandgap than silicon, a silicon carbide transistor cell is less prone to latch-up and a lateral alignment of the source zone 110 and the contact portion 128 is less critical than in a silicon device. The first load electrode 310 may form planar ohmic contacts to the source zone 110 and to the body region 120 and elaborate processing of trench contacts may be avoided.

The auxiliary electrode 157 may be electrically connected to the first load electrode 310 in end portions of the trench structure 150 outside a transistor cell array including the transistor cells TC, and/or at selected positions within the transistor cell array. For example, the auxiliary electrode 157 may include connection portions extending from a top to a bottom of the trench structure 150. The connection portions may locally interrupt the gate electrode 155 in one of the stripe portions 161, 162. The connection portions may be placed such that local interruptions of the gate electrode 155 in one of the stripe portions 161, 162 are by-passed by continuous portions of the gate electrode 155 in adjacent stripe portions 161, 162.

A second load electrode 320 on the rear side may directly contact a base portion 139 of the drift structure 130. The base portion 139 may form an ohmic contact with the second load electrode 320 and may directly adjoin the drift zone 131.

The shape of the shielding region 140 may be that of a smooth horizontal layer perforated by comparatively small counter-doped passages for the on-state current but with a comparatively flat interface to the drain structure 130 in the rest such that the shielding region 140 can shield the body region 120 with high efficiency against the potential at the second load electrode 320.

Compared to shielding structures with large counterdoped passages and/or with steps at the interface to the drift structure 130, the shielding region 140 may provide a more uniform distribution of the electric field. A uniform electric field improves voltage blocking capability and radiation hardness of the semiconductor device 500.

The efficient shielding also reduces the effect of a depletion zone on the body region 120 such that the vertical extension of the body region 120 and the length of the inversion channel of the transistor cell can be reduced. Since in silicon carbide the resistance of the inversion channel dominates the on-state resistance at least for semiconductor devices with a nominal blocking voltage of 1700V and less, the effective layer-like shielding region 140 can be used to significantly reduce the on-state resistance RDSon. This effect adds to the increase of channel-width by using more than two sides of the mesa portion 190 for the inversion channel.

The highly effective shielding region 140 may further allow a higher doping in a region of the drift structure 130 along the second pn junction pn2. The higher doping improves a lateral distribution of the on-state current through the drift structure 130 and may further reduce the on-state resistance RDSon. The shielding region 140 further reduces the drain-induced barrier lowering (DIBL) such that the impact of the potential at the second load electrode 320 on the threshold voltage of the transistor cell TC remains low.

Also, in case of a short-circuit condition, the shielding region 140 effectively shields the body region 120 and attenuates a reduction of the channel length. Since a reduction of channel length results in increased drain current, by avoiding the channel length reduction, the shielding region effectively improves short-circuit ruggedness.

Since the shielding region 140 is directly connected to the first load electrode 310 through a low-impedance path outside the silicon carbide crystal, the shielding region 140 may be used as efficient body diode. The electric resistance of the low-impedance path attenuates oscillations that may be triggered by the switching of the transistor cell TC.

A voltage breakdown through the shielding region 140 results in that the generated holes reach the first load electrode 310 along a low-ohmic path through the auxiliary electrode 157. Gate dielectric 153 and field dielectric 159 remain free of negative effects resulting from charge carrier generation in portions of the silicon carbide crystal close to the gate dielectric 153 and/or the field dielectric 159.

The shielding region 140 may further reduce the reverse transfer capacity Crss, wherein a low Crss allows faster switching cycles and/or lower switching losses. On the other hand, the shielding region 140 forms part of A gate-to-source capacitor that provides more stable behavior of the semiconductor device 500 in view of drain-to-source voltage VDS fluctuations and noise.

Figure 9A:
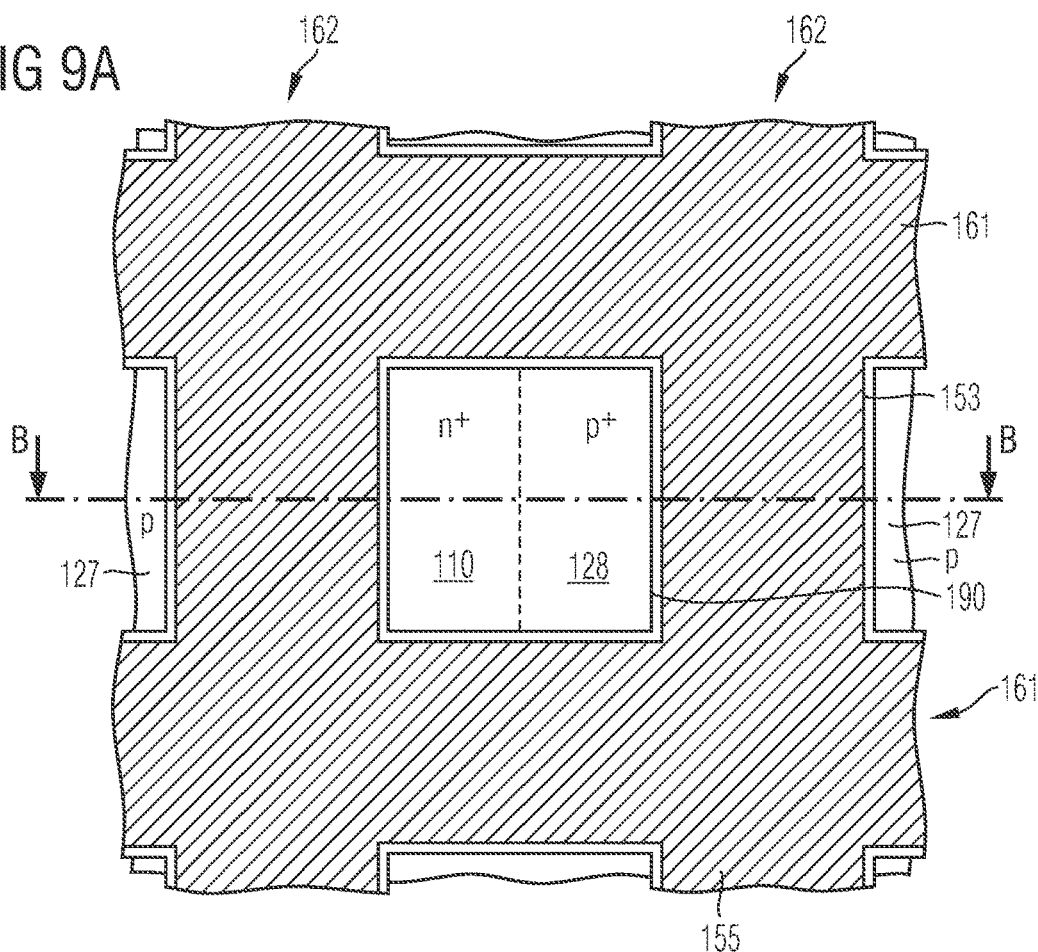
FIGS. 9A and 9B show schematic horizontal and vertical cross-sectional views of a portion of a semiconductor device according to a further embodiment related to a grid-shaped trench structure.
Figure 9B:
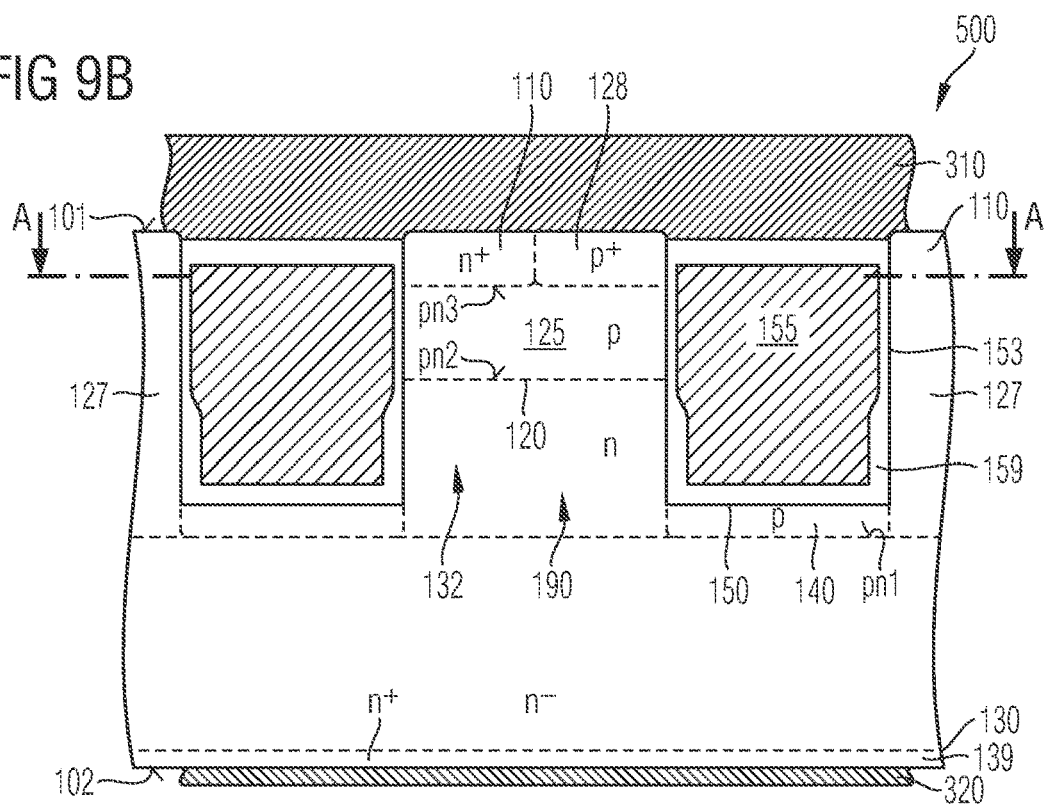

In FIGS. 9A to 9B the gate electrode 155 extends down to the trench bottom and a portion of the field dielectric 159 separates the shielding region 140 from the gate electrode 157. The field electrode 159 may have a greater thickness than the gate dielectric 153. First mesa portions 191 may include the body zones 120 and the source zones 110 of transistor cells TC. Second mesa portions 192 may include diode regions 127 of the conductivity type of the shielding region 140. The diode regions 127 may connect the shielding region 140 with the first load electrode 310.

The drift structure 130 may include current spread regions 132 that directly adjoin the body regions 120. The current spread regions 132 have the conductivity type of the drift zone 131 and horizontally distribute the on-state charge carrier flow. The current spread regions 132 may reduce a junction field effect occurring between neighboring portions of the shielding region 140 or may be used to adjust the strength of the junction field effect.

The trench structure 150 may have vertical sidewalls, sidewalls tilted to the vertical direction or bulgy sidewalls. The stripe portions 161, 162 of the trench structure 150 may taper with increasing distance to the first surface 101, wherein the junction field effect between neighboring portions of the shielding region 140 may be reduced. Alternatively, the stripe portions 161, 162 of the trench structure 150 may taper with decreasing distance to the first surface 101, wherein the junction field effect between neighboring portions of the shielding region 140 as well as the shielding efficiency of the shielding region 140 may be further increased.

Figure 10A:
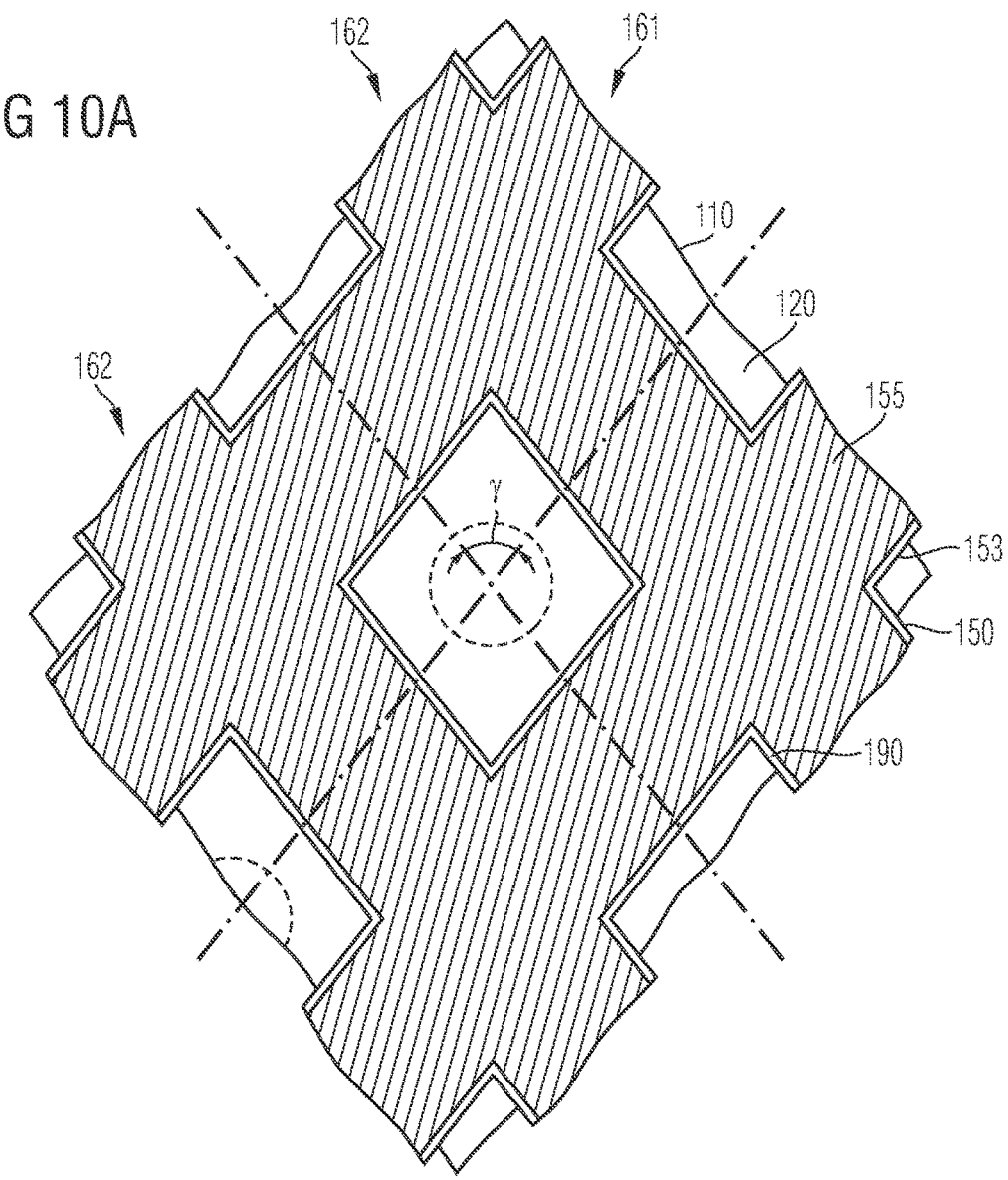
FIGS. 10A and 10B show schematic horizontal cross-sectional view of portions of semiconductor devices according to further embodiments.

FIG. 10A shows a mesa portion 190 which horizontal cross-section is a rhombus. The trench structure 150 includes parallel first stripe portions 161 and parallel second stripe portions 162 that intersect the first stripes 161 at a tilt angle γ, wherein the tilt angle γ may be smaller than 90° and at least 10°. Both first stripe portions 161 and second stripe portions 162 are straight stripes.

Figure 10B:
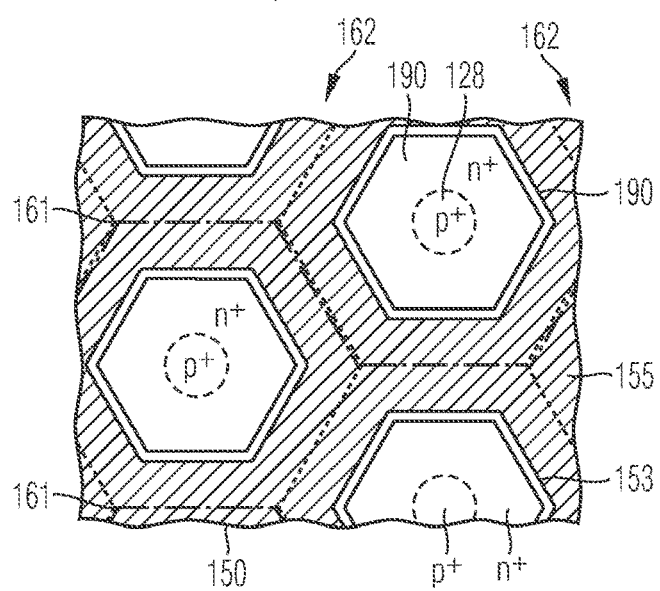

FIG. 10B shows a mesa portion 190 which horizontal cross-section is a regular hexagon. The trench structure 150 includes parallel first stripe portions 161 and second stripe portions 162 that intersect the first stripe portions 161. The set of second stripe portions 162 includes symmetric pairs of second stripe portions 162, wherein the second stripe portions 162 of a symmetric pair are symmetric to each other with respect to an intermediate symmetry axis. Sections of the first stripe portions 161 may overlap with sections of the second stripe portions 162. The first stripes 161 and the second stripes 162 are meandering stripes.

FIGS. 11 and 12A to 12G show exemplary embodiments of methods of manufacturing a silicon carbide device. The silicon carbide device may be a semiconductor device as described herein, in particular in connection with the embodiments of FIGS. 1, 2A, 2B, 2C, 2D, 3A, 3B, 3C, 4A, 4B, 4C, 4D, 4E, 5A, 5B, 6A, 6B, 7A, 7B, 8A, 8B, 9A, 9B, 10A and 10B. Vice versa, a semiconductor device described herein may be manufactured with a method as described in connection with the embodiments of FIGS. 11 and 12A to 12G.

Figure 11:
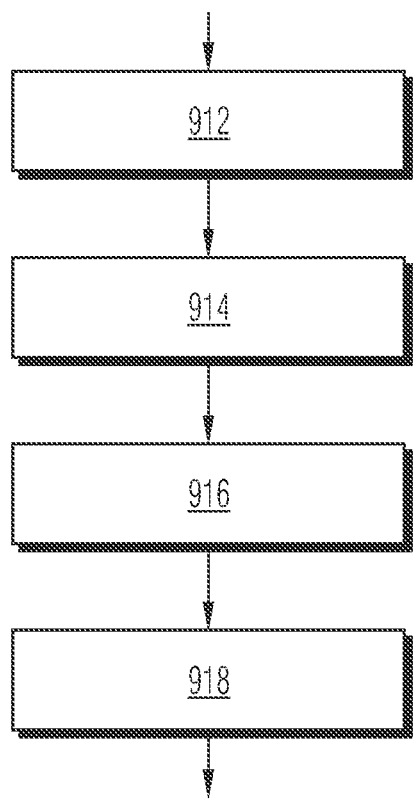
FIG. 11 is a simplified flowchart of a method of manufacturing semiconductor devices with auxiliary electrodes adjoining buried shielding regions according to an embodiment.

According to FIG. 11 a method of manufacturing a silicon carbide device with transistor cells TC including trench gate electrodes includes forming trenches in a process surface of a silicon carbide substrate (912), wherein the semiconductor substrate includes a body layer that forms a second pn junction with a drift layer and wherein the trenches extend through the body layer and expose the drift layer structure. Through a bottom of the trenches dopants are implanted to form shielding regions (914), wherein the shielding regions form first pn junctions with the drift layer structure. Dielectric spacers are formed on opposite long sides of the trenches 750 (916). A conductive material is deposited to form a buried portion of an auxiliary electrode that forms a low-resistive contact with the shielding regions (918). The method provides comparatively deep shielding regions at comparatively low additional effort.

FIGS. 12A to 12G refer to a method of manufacturing a silicon carbide device on the basis of a silicon carbide substrate 700. The silicon carbide substrate 700 may be of 4H—SiC and may include a heavily doped base substrate 705 which may be a silicon carbide slice obtained from a silicon ingot by sawing, by way of example. The base substrate 705 may be heavily doped, for example, heavily n-doped. A drift layer structure 730 forming a unipolar junction with the base substrate 705 may be formed on a process surface of the base substrate 705, e.g., by epitaxy. A body layer 720 from the opposite conductivity type of the drift layer structure 730 may be formed on a top surface of the drift layer structure 730, e.g., by epitaxy or by implanting dopants. A source layer 710 of the conductivity type of the drift layer structure 730 may be formed on the body layer 720, for example, by implanting donors into a portion of the previously grown body layer 720 or by deposition, e.g., by epitaxy. The source layer 710 may also be formed at a later process stage.

According to an embodiment, heavily doped contact portions of the conductivity type of the body layer 720 may be formed, e.g., by ion implantation. The contact portions may extend from a process surface 701 of the silicon carbide substrate 700 down to or into the body layer 720.

A mask layer is deposited on the process surface 701 of the source layer 710 or, if applicable, on the body layer 720. Photolithography forms a trench mask 790 from the mask layer. One grid-like trench or a plurality of stripe-shaped trenches 750 are formed in the vertical projection of one or more openings in the trench mask 790, wherein the one or more trenches 750 extend through the body layer 720 and into the drift layer structure 730.

Figure 12A:
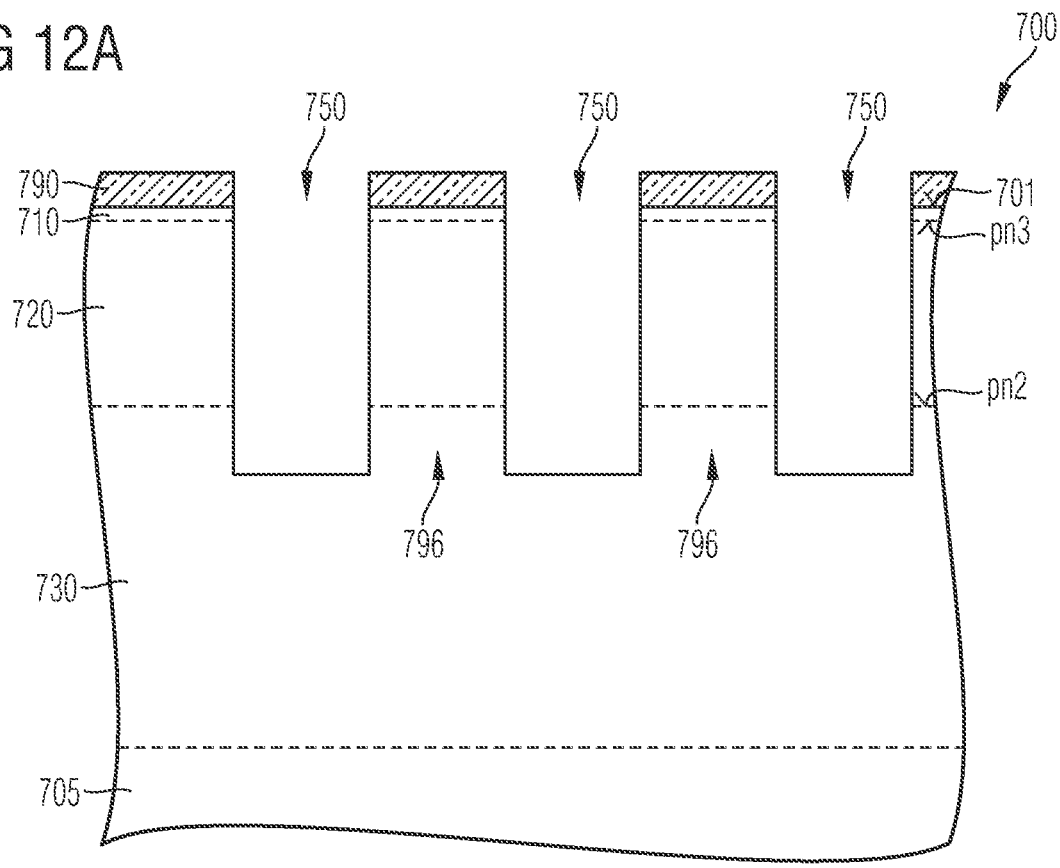
FIG. 12A is a schematic vertical cross-sectional view of a portion of a semiconductor substrate for illustrating a method of manufacturing semiconductor devices with auxiliary electrodes adjoining shielding regions, after forming trenches.

FIG. 12A shows the silicon carbide substrate 700 with a body layer 720 forming second pn junctions pn2 with the drift layer structure 730 and third pn junctions pn3 with the source layer 710. The trenches 750 perforate the body layer 720 and extend into an upper portion of the drift layer structure 730. As regards shape and dimensions of the trench(es) 750 and of mesa sections 796 of the silicon carbide substrate 700 between the trenches 750 or between sections of a single trench 750 reference is made to the shape and dimensions of the trench structures and the mesa portions described with reference to the previous Figures.

Dopants of the conductivity type opposite to the conductivity type of the drift layer structure 730 may be implanted through the bottom of the one or more trenches 750, wherein the trench mask 790 may be used as an implant mask.

FIG. 12B shows one or more shielding regions 140 formed by the implant in the vertical projection of the trench(es) 750. Comparatively deep shielding regions 140 may be formed at comparatively moderate acceleration energies. An auxiliary material 792 may be deposited that is selectively removable from silicon carbide and a heating treatment may anneal implant damage and/or activate implanted dopants may restoring the crystal lattice of the silicon carbide substrate 700.

FIG. 12C shows the auxiliary material 792 that may partly or completely fill the one or more trenches 750 and/or that may cover the trench(es) 750. The auxiliary material 792 may stabilize the mesa sections 796 during the heating treatment. The auxiliary material 792 may be removed and a heating treatment in an oxidizing ambient may form a sacrificial oxide layer 794 on exposed portions of the silicon carbide substrate 700.

Figure 12D:
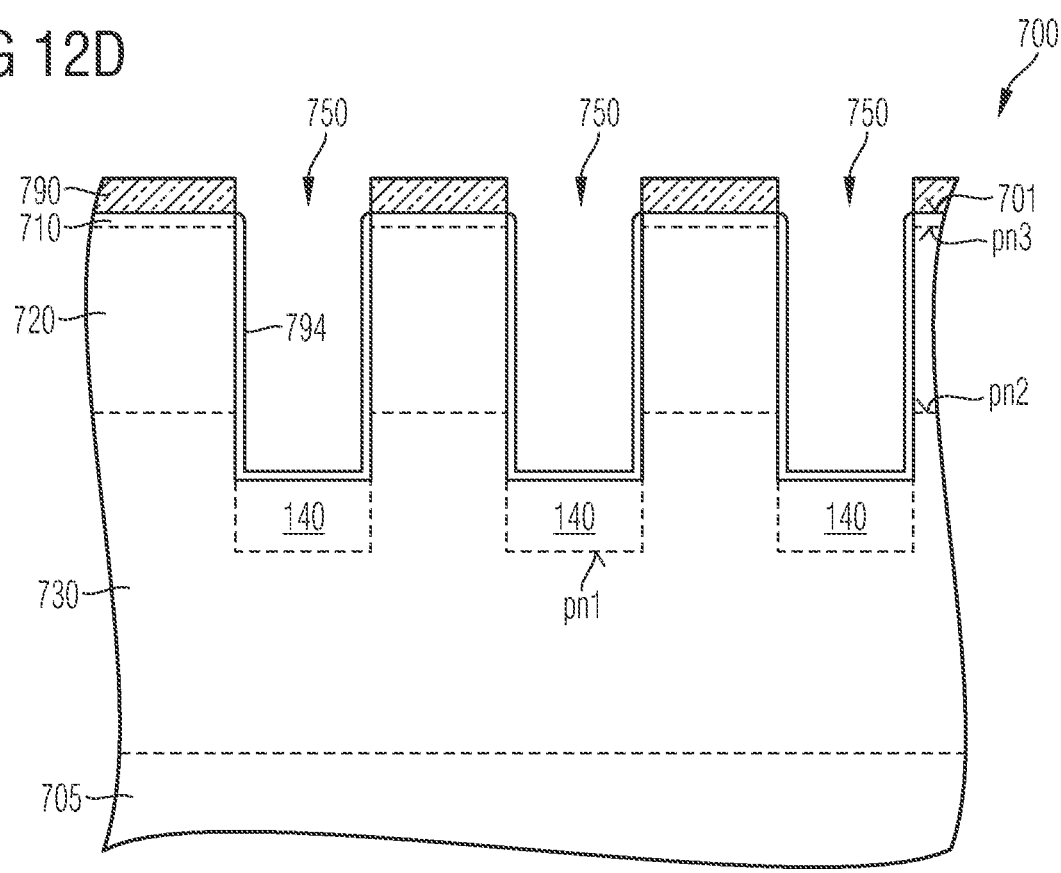
FIG. 12D is a schematic vertical cross-sectional view of the semiconductor substrate portion of FIG. 12C after formation of a sacrificial oxide layer.

FIG. 12D shows the sacrificial oxide layer 794 lining the trench(es) 750. The sacrificial oxide layer 794 may be removed. Formation and removal of the sacrificial oxide layer 794 may remove dopant atoms from sidewalls of the trench(es) 750. Alternatively or in addition a sacrificial oxide layer may be formed by oxidation and/or deposition prior to the implant, wherein the sacrificial oxide layer may be effective as stray oxide for the implant.

Dielectric spacers 759 may be formed on sidewalls of the trench(es) 750, e.g., by a spacer process that includes deposition of a conformal layer of uniform thickness and selective removal of horizontal portions of the deposited layer by an anisotropic etch.

Figure 12E:
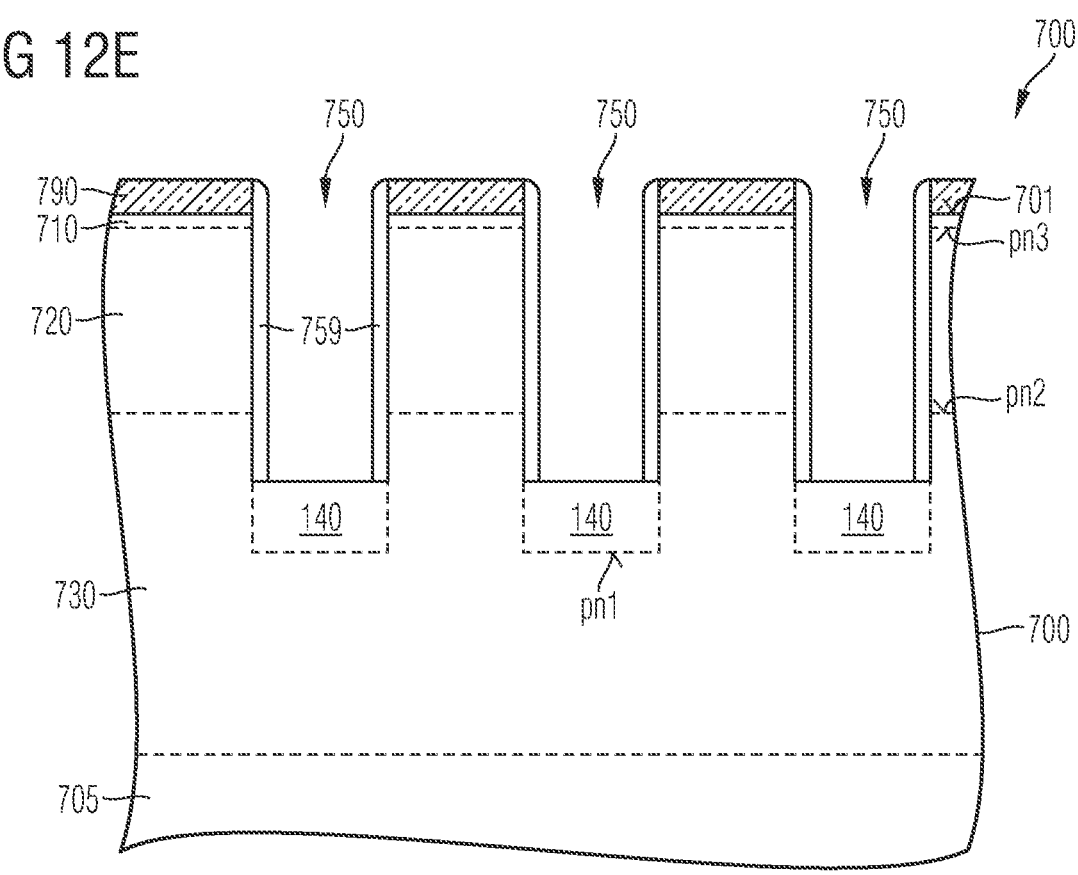
FIG. 12E is a schematic vertical cross-sectional view of the semiconductor substrate portion of FIG. 12D, after forming dielectric spacers.

FIG. 12E shows the dielectric spacers 759 covering sidewalls of the trench(es) 750 and leaving exposed a bottom of the trench(es) 750. An interface layer may be formed at the bottom of the trench(es) 750, e.g., by salicidation of nickel aluminum NiAl. A further conductive material may be deposited and recessed to form at least buried portions 1571 of an auxiliary electrode 157 in bottom sections of the trenches 750. The recess may include CMP (chemical mechanical polishing). A separation dielectric 156 may be selectively formed on an exposed surface of the material of the auxiliary electrode 157. For example, formation of the auxiliary electrode 157 includes deposition of heavily doped polycrystalline silicon and formation of the separation dielectric 156 may include an oxidation process which growth rate on polycrystalline silicon is significantly higher than on single crystalline silicon carbide. Before or after forming the separation dielectric 156, the buried portion 1571 may be used as an etch mask for removing exposed portions of the dielectric spacers 759 to form, from a bottom portion of the dielectric spacers 759, a field dielectric 159 laterally separating the buried portion 1571 from the drift layer structure 730.

Figure 12F:
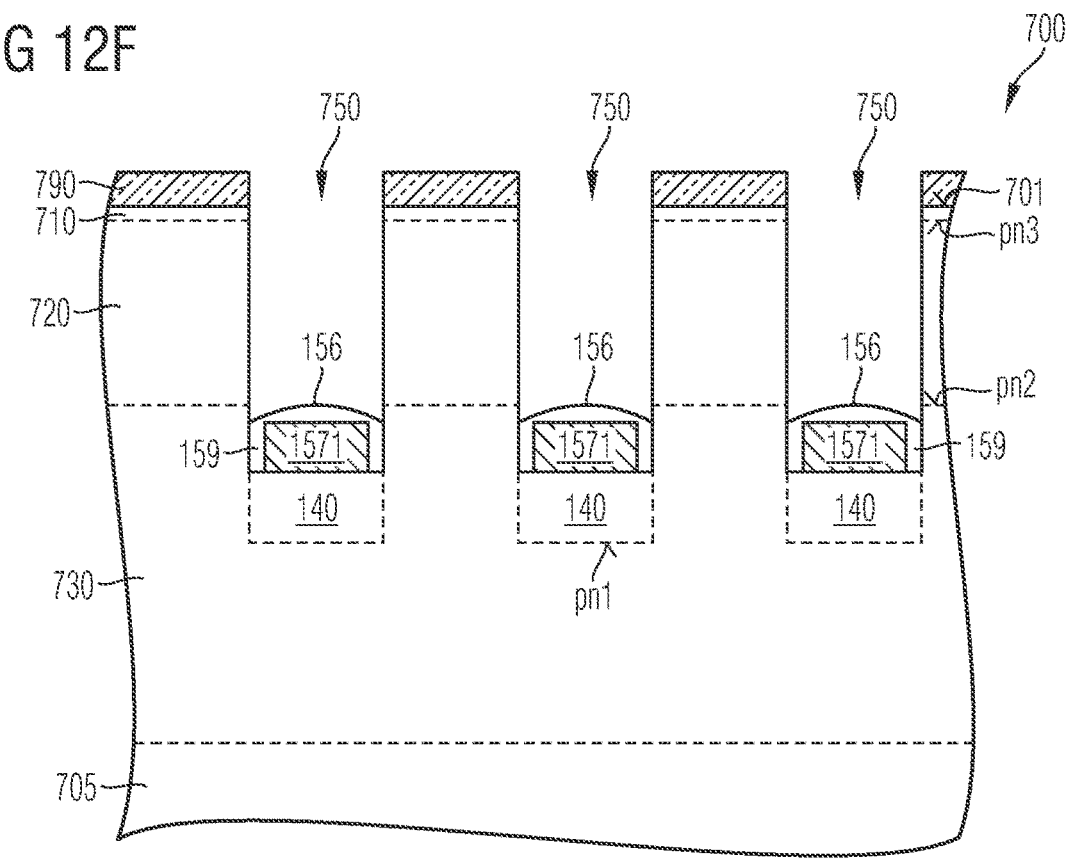
FIG. 12F is a schematic vertical cross-sectional view of the semiconductor substrate portion of FIG. 12E, after a selective oxidation of an auxiliary electrode formed in a bottom portion of the trenches.

FIG. 12F shows the buried portions 1571 covered with the separation dielectric 156 and laterally separated from the drift layer structure 730 by the field dielectric 159.

The trench mask 790 may be removed, a gate dielectric layer 753 may be formed, for example by depositing silicon oxide, densifying the deposited silicon oxide in a heat treatment and introducing nitrogen into the deposited layer. A conductive material, for example, heavily doped polycrystalline silicon may be deposited and recessed to fill a top section of the trench(es) 750. The recess may include CMP.

Figure 12G:
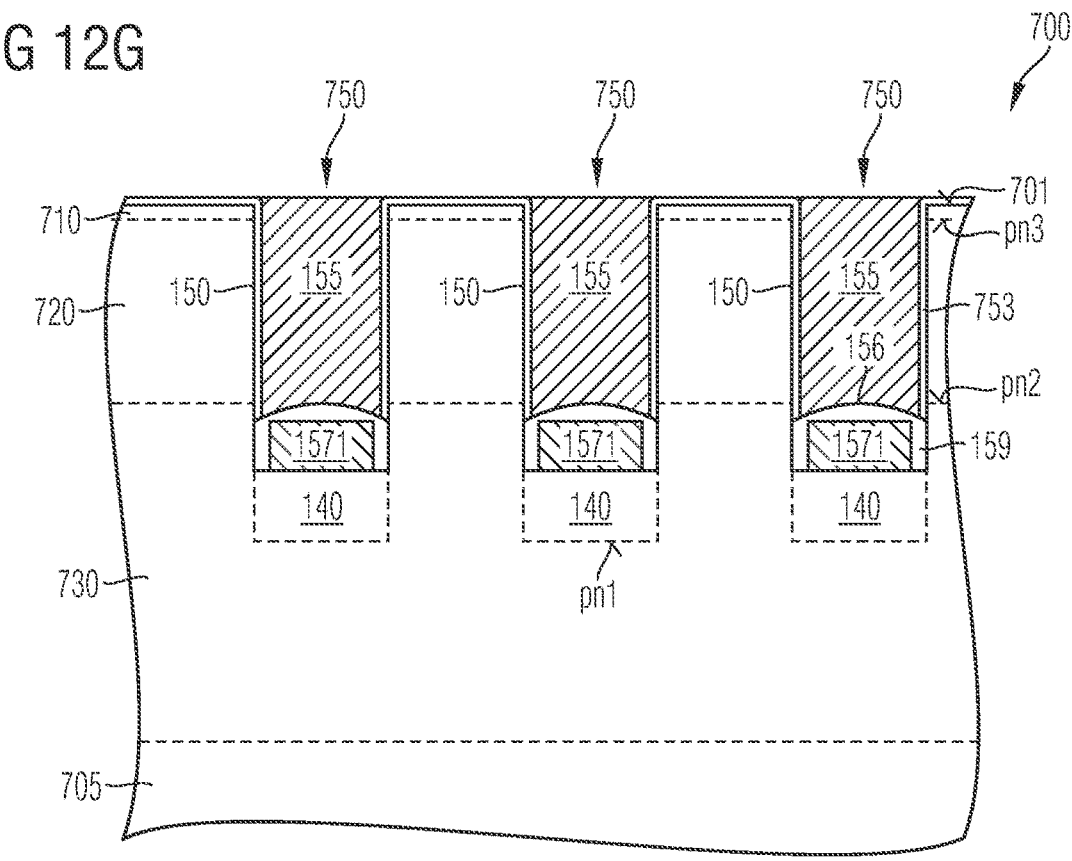
FIG. 12G is a schematic vertical cross-sectional view of the semiconductor substrate portion of FIG. 12F, after forming a gate electrode.

FIG. 12G shows the gate electrode 155 formed from the heavily doped polycrystalline material in the top section of the trench(es) 750. An interlayer dielectric may be deposited and partly recessed to expose the process surface 701 of the silicon carbide substrate 700. The recess may include CMP.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a trench structure extending from a first surface of a silicon carbide semiconductor body into the silicon carbide semiconductor body, the trench structure comprising a gate electrode that is dielectrically insulated from the silicon carbide semiconductor body;
   a shielding region adjoining a bottom of the trench structure and forming a first pn junction with a drift structure of the silicon carbide semiconductor body;
   a body region forming a second pn junction with the drift structure;
   a source zone arranged between the first surface and the body region and forming a third pn junction with the body region; and
   a contact portion of the body region that extends to the first surface;
   wherein the source zone surrounds the contact portion of the body region at the first surface, and wherein the trench structure forms an enclosed loop at the first surface that surrounds the source zone and the contact portion of the body region at the first surface, wherein the trench structure further comprises an auxiliary electrode.

2. The semiconductor device of claim 1, wherein the semiconductor device comprises a plurality of areas with the source zone surrounding the contact portion of the body region at the first surface, and wherein the trench structure surrounds each of the areas from the plurality.

3. The semiconductor device of claim 1, wherein the enclosed loop formed by the trench structure has a rectangular geometry.

4. The semiconductor device of claim 1, wherein the auxiliary electrode adjoins the shielding region at the bottom of the trench structure.

5. The semiconductor device of claim 1, wherein the trench structure comprises a separation dielectric that electrically insulates the auxiliary electrode from the gate electrode.

6. The semiconductor device of claim 1, wherein the enclosed loop formed by the trench structure has a hexagonal geometry.

7. The semiconductor device of claim 6, wherein the semiconductor device comprises a plurality of areas with the source zone surrounding the contact portion of the body region at the first surface, and wherein the trench structure has a hexagonal geometry around each of the areas from the plurality.

8. The semiconductor device of claim 7, wherein the trench structure comprises a set of parallel first stripe portions and a set second stripe portions that intersect the first stripe portions, and wherein set of second stripe portions are symmetric to each other with respect to an intermediate symmetry axis.

9. The semiconductor device of claim 8, wherein the first stripe portions have the same width as the second stripe portions.

10. A semiconductor device, comprising:
a trench structure extending from a first surface of a silicon carbide semiconductor body into the silicon carbide semiconductor body, the trench structure comprising a gate electrode that is dielectrically insulated from the silicon carbide semiconductor body;
a shielding region in ohmic contact with an auxiliary electrode at a bottom of the trench structure and forming a first pn junction with a drift structure of the silicon carbide semiconductor body;
a body region forming a second pn junction with the drift structure;
a source zone arranged between the first surface and the body region and forming a third pn junction with body region; and
a contact portion of the body region and the source zone that each extend to the first surface,
wherein the trench structure has a hexagonal geometry.

11. The semiconductor device of claim 10, wherein the hexagonal geometry of the trench structure encloses the body region and the source zone at the first surface.

12. The semiconductor device of claim 10, wherein the auxiliary electrode includes an interface layer that forms part of the ohmic contact with the shielding region.

13. A semiconductor device, comprising:
a trench structure extending from a first surface of a silicon carbide semiconductor body into the silicon carbide semiconductor body, the trench structure comprising a gate electrode that is dielectrically insulated from the silicon carbide semiconductor body;
a shielding region adjoining a bottom of the trench structure and forming a first pn junction with a drift structure of the silicon carbide semiconductor body;
a body region forming a second pn junction with the drift structure;
a source zone arranged between the first surface and the body region and forming a third pn junction with the body region; and
a contact portion of the body region that extends to the first surface;
wherein the source zone surrounds the contact portion of the body region at the first surface, and
wherein the trench structure forms an enclosed loop at the first surface that surrounds the source zone and the contact portion of the body region at the first surface,
wherein the enclosed loop formed by the trench structure has a rhombus geometry.

* * * * *

UNITED STATES PATENT AND TRADEMARK OFFICE
CERTIFICATE OF CORRECTION

PATENT NO. : 12,300,724 B2
APPLICATION NO. : 17/496050
DATED : May 13, 2025
INVENTOR(S) : A. Meiser et al.

Page 1 of 1

It is certified that error appears in the above-identified patent and that said Letters Patent is hereby corrected as shown below:

In the Claims

Column 21, Line 32 (Claim 8) please change "set second" to -- set of second --

Column 21, Line 33 (Claim 8) please change "wherein set" to -- wherein the set --

Signed and Sealed this
Eighth Day of July, 2025

Coke Morgan Stewart
*Acting Director of the United States Patent and Trademark Office*